US012784844B2

(12) United States Patent
Joo

(10) Patent No.: US 12,784,844 B2
(45) **Date of Patent: *Nov. 3, 2026**

(54) MEMORY DEVICE AND METHOD OF OPERATING THE SAME USING MULTI-LEVEL PASS VOLTAGES DURING A PROGRAM OPERATION

(71) Applicant: SK hynix Inc., Icheon-si (KR)

(72) Inventor: Han Soo Joo, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 190 days.

This patent is subject to a terminal disclaimer.

(21) Appl. No.: 18/794,169

(22) Filed: Aug. 5, 2024

(65) Prior Publication Data

US 2024/0395340 A1 Nov. 28, 2024

Related U.S. Application Data

(63) Continuation of application No. 17/833,114, filed on Jun. 6, 2022, now Pat. No. 12,080,357.

(30) Foreign Application Priority Data

Feb. 10, 2022 (KR) ........................ 10-2022-0017783

(51) Int. Cl.
*G11C 16/10* (2006.01)
*G11C 16/34* (2006.01)

(52) U.S. Cl.
CPC .......... *G11C 16/3404* (2013.01); *G11C 16/10* (2013.01)

(58) Field of Classification Search
CPC ...................................................... G11C 16/10
See application file for complete search history.

(56) References Cited

U.S. PATENT DOCUMENTS 8,644,075 B2 2/2014 Hemink et al.
2009/0040833 A1* 2/2009 Shin .................. G11C 16/3427 365/185.18
2021/0319830 A1 10/2021 Park
(Continued)

FOREIGN PATENT DOCUMENTS

CN 106057237 A 10/2016
CN 113517017 A 10/2021
KR 1020090014531 A 2/2009
(Continued)

*Primary Examiner* — Hoai V Ho
(74) *Attorney, Agent, or Firm* — WILLIAM PARK AND ASSOCIATES LTD.

(57) ABSTRACT

According to an embodiment of the present disclosure, a memory device, a peripheral circuit configured to perform a program operation, including a plurality of program loops, and a control logic configured to, in some of the plurality of loops of the program operation, control the peripheral circuit to apply a program voltage to a selected word line, apply a first pass voltage to adjacent word lines that are adjacent to the selected word line, and then apply a second pass voltage to adjacent word lines at a predetermined time point, wherein the second pass voltage has a different magnitude compared to the first pass voltage, and in the rest of the plurality of loops of the program operation, control the peripheral circuit to apply the second pass voltage to the adjacent word lines at a time point that is different from the predetermined time point from a selected loop.

18 Claims, 17 Drawing Sheets

(56) References Cited

U.S. PATENT DOCUMENTS

2022/0036944 A1 2/2022 Han

FOREIGN PATENT DOCUMENTS

| | | | |
|---|---|---|---|
| KR | 1020140036259 | A | 3/2014 |
| KR | 1020160120990 | A | 10/2016 |
| KR | 1020170079832 | A | 7/2017 |
| KR | 1020170114349 | A | 10/2017 |
| KR | 1020190023893 | A | 3/2019 |

* cited by examiner

MEMORY DEVICE AND METHOD OF OPERATING THE SAME USING MULTI-LEVEL PASS VOLTAGES DURING A PROGRAM OPERATION

CROSS-REFERENCE TO RELATED APPLICATION

The present application is a continuation application of U.S. patent application Ser. No. 17/833,114, filed on Jun. 6, 2022, which claims priority under 35 U.S.C. § 119(a) to Korean patent application number 10-2022-0017783 filed on Feb. 10, 2022, in the Korean Intellectual Property Office, the entire contents of which applications are incorporated herein by reference.

BACKGROUND

1. Technical Field

The present disclosure relates to an electronic device, and more particularly, to a memory device and a method of operating the same.

2. Related Art

A storage device is a device that stores data under control of a host device such as a computer or a smartphone. A storage device may include a memory device in which data is stored and a memory controller controlling the memory device. The memory device is divided into a volatile memory device and a nonvolatile memory device.

The volatile memory device is a device that stores data only when power is supplied and loses the stored data when the power supply is cut off. The volatile memory device includes a static random access memory (SRAM), a dynamic random access memory (DRAM), and the like.

The nonvolatile memory device is a device that does not lose data even though power is cut off. The nonvolatile memory device includes a read only memory (ROM), a programmable ROM (PROM), an electrically programmable ROM (EPROM), an electrically erasable and programmable ROM (EEPROM), a flash memory, and the like.

SUMMARY

According to an embodiment of the present disclosure, a memory device may include a plurality of memory cells connected to each of a plurality of word lines, a peripheral circuit configured to perform a program operation, including a plurality of program loops, on memory cells that are connected to a selected word line, among the plurality of word lines, and a control logic configured to, while a program voltage is applied to the selected word line, control the peripheral circuit to apply a first pass voltage to adjacent word lines that are adjacent to the selected word line, and then apply a second pass voltage higher than the first pass voltage to the adjacent word lines, wherein the control logic adjusts an application time of the second pass voltage as the plurality of program loops proceed.

According to an embodiment of the present disclosure, a memory device may include a plurality of memory cells connected to each of a plurality of word lines, a peripheral circuit configured to perform a program operation, including a plurality of program loops, on memory cells that are connected to a selected word line, among the plurality of word lines, and a control logic configured to, in some of the plurality of loops of the program operation, control the peripheral circuit to apply a program voltage to the selected word line and configured to apply a pass voltage that increases at two or more time points to adjacent word lines that are adjacent to the selected word line, wherein the control logic is configured to, in the rest of the plurality of program loops of the program operation, control the peripheral circuit to apply a pass voltage that increases at time points that are different from the at least two or more time points at which the pass voltage increases in the some of the plurality of program loops.

According to an embodiment of the present disclosure, a method of operating a memory device performing a program operation including a plurality of program loops on memory cells that are connected to a selected word line, among a plurality of word lines, may include applying a program voltage to the selected word line, and applying a pass voltage to adjacent word lines that are adjacent to the selected word line while the program voltage is applied, wherein applying the pass voltage comprises applying a first pass voltage to the adjacent word lines for a first time period, applying a second pass voltage higher than the first pass voltage to the adjacent word lines for a second time period which is adjusted as the plurality of program loops proceed.

DETAILED DESCRIPTION

Specific structural or functional descriptions of embodiments according to the concept which are disclosed in the present specification or application are illustrated only to describe the embodiments according to the concept of the present disclosure. The embodiments according to the concept of the present disclosure may be carried out in various forms and should not be construed as being limited to the embodiments described in the present specification or application.

Hereinafter, the present disclosure is described in detail by describing preferred embodiments of the present disclosure with reference to the accompanying drawings. Hereinafter, an embodiment of the present disclosure is described in detail with reference to the accompanying drawings.

An embodiment of the present disclosure provides a memory device in which a threshold voltage distribution deterioration phenomenon due to interference between adjacent memory cells is improved.

According to the present technology, a memory device in which a threshold voltage distribution deterioration phenomenon due to interference between adjacent memory cells is improved is provided.

Figure 1:
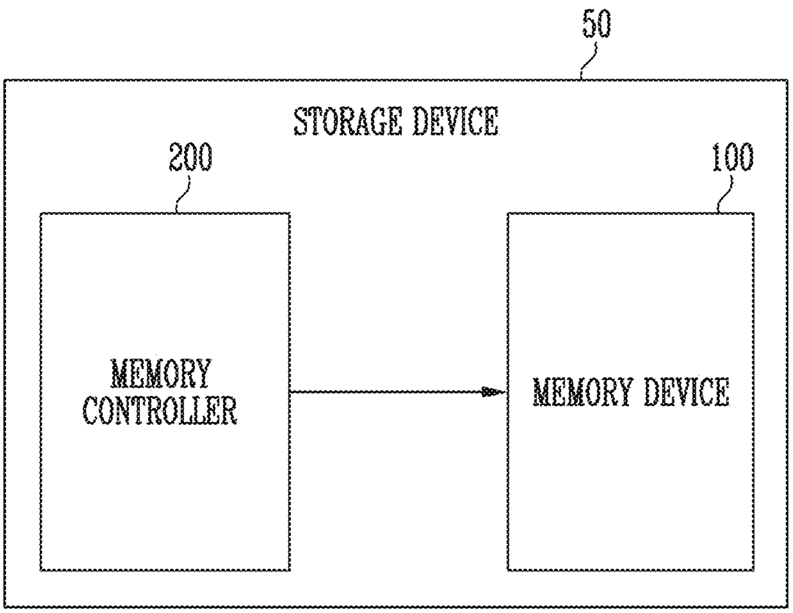
FIG. 1 is a diagram illustrating a storage device according to an embodiment.

FIG. 1 is a diagram illustrating a storage device according to an embodiment.

Referring to FIG. 1, a storage device 50 may include a memory device 100 and a memory controller 200 that controls an operation of the memory device. The storage device 50 is a device that stores data based on instructions from a host, such as a cellular phone, a smartphone, an MP3 player, a laptop computer, a desktop computer, a game player, a TV, a tablet PC, or an in-vehicle infotainment system.

The storage device 50 may be manufactured as one of various types of storage devices according to a host interface that is a communication method with the host. For example, the storage device 50 may be configured as any one of various types of storage devices, such as an SSD, a multimedia card in a form of an MMC, an eMMC, an RS-MMC and a micro-MMC, a secure digital card in a form of an SD, a mini-SD and a micro-SD, a universal serial bus (USB) storage device, a universal flash storage (UFS) device, a personal computer memory card international association (PCMCIA) card type storage device, a peripheral component interconnection (PCI) card type storage device, a PCI express (PCI-E) card type storage device, a compact flash (CF) card, a smart media card, and a memory stick.

The storage device 50 may be manufactured as any one of various types of packages, such as a package on package (POP), a system in package (SIP), a system on chip (SOC), a multi-chip package (MCP), a chip on board (COB), a wafer-level fabricated package (WFP), and a wafer-level stack package (WSP).

The memory device 100 may store data. The memory device 100 may operate based on instructions from the memory controller 200. The memory device 100 may include a memory cell array including a plurality of memory cells that store data. The memory cell array may include a plurality of memory blocks. Each memory block may include a plurality of memory cells. One memory block may include a plurality of pages. In an embodiment, the page may be a unit for storing data in the memory device 100 or reading data stored in the memory device 100. The memory block may be a unit for erasing data. In an embodiment, the memory device 100 may be a double data rate synchronous dynamic random access memory (DDR SDRAM), a low power double data rate4 (LPDDR4) SDRAM, a graphics double data rate (GDDR) SDRAM, a low power DDR (LPDDR), a Rambus dynamic random access memory (RDRAM), a NAND flash memory, a vertical NAND flash memory, a NOR flash memory, a resistive random access memory (RRAM), a phase-change random access memory (PRAM), a magnetoresistive random access memory (MRAM), a ferroelectric random access memory (FRAM), a spin transfer torque random access memory (STT-RAM), or the like. In the present specification, for convenience of description, it is assumed that the memory device 100 is a NAND flash memory.

The memory device 100 may be configured to receive a command and an address from the memory controller 200 and access an area that is selected by the address of the memory cell array. That is, the memory device 100 may perform an operation that is the command on the area that is selected by the address. For example, the memory device 100 may perform a write operation (program operation), a read operation, and an erase operation. During the program operation, the memory device 100 may program data to the area that is selected by the address. During the read operation, the memory device 100 may read data from the area that is selected by the address. During the erase operation, the memory device 100 may erase data stored in the area that is selected by the address.

In an embodiment, the memory device 100 may receive a program command, data, and an address from the memory controller 200. The memory device 100 may program the data in an area that is selected by the address that is received from the memory controller 200 in response to the program command that is received from the memory controller 200. The memory device 100 may apply a program voltage to a selected word line in a selected program operation. The memory device 100 may apply a pass voltage to adjacent word lines that are adjacent to the selected word line while the program voltage is applied to the selected word line. The pass voltage that is applied to the adjacent word lines may be formed in at least two or more steps. For example, while the program voltage is applied to the selected word line, a first pass voltage may be applied to the adjacent word lines, and then a second pass voltage having a different magnitude compared to the first pass voltage may be applied at a predetermined time point. The magnitude of the second pass voltage may be greater than the magnitude of the first pass voltage.

The memory controller 200 may control the overall operation of the storage device 50.

When power is applied to the storage device 50, the memory controller 200 may execute firmware (FW). When the memory device 100 is a flash memory device, the memory controller 200 may operate firmware, such as a flash translation layer (FTL) for controlling communication between the host and the memory device 100.

In an embodiment, the memory controller 200 may receive data and a logical block address (LBA) from the host and convert the LBA into a physical block address (PBA) indicating an address of memory cells in which data included in the memory device 100 is to be stored.

The memory controller 200 may control the memory device 100 to perform the program operation, the read operation, or the erase operation in response to a request from the host. During the program operation, the memory controller 200 may provide a program command, the PBA, and data to the memory device 100. During the read operation, the memory controller 200 may provide a read command and the PBA to the memory device 100. During the erase operation, the memory controller 200 may provide an erase command and the PBA to the memory device 100.

In an embodiment, the memory controller 200 may generate and transmit the program command, the address, and the data to the memory device 100 without the request from the host. For example, the memory controller 200 may provide the command, the address, and the data to the memory device 100 to perform background operations, such as a program operation for wear leveling and a program operation for garbage collection.

In an embodiment, the memory controller 200 may control at least two memory devices 100. In this case, the memory controller 200 may control the memory devices 100 according to an interleaving method to improve operation performance.

The host may communicate with the storage device 50 by using at least one of various communication methods, such as a universal serial bus (USB), a serial AT attachment (SATA), a serial attached SCSI (SAS), a high speed interchip (HSIC), a small computer system interface (SCSI), a peripheral component interconnection (PCI), a PCI express (PCIe), a nonvolatile memory express (NVMe), a universal flash storage (UFS), a secure digital (SD), a multimedia card (MMC), an embedded MMC (eMMC), a dual in-line memory module (DIMM), a registered DIMM (RDIMM), and a load reduced DIMM (LRDIMM).

Figure 2:
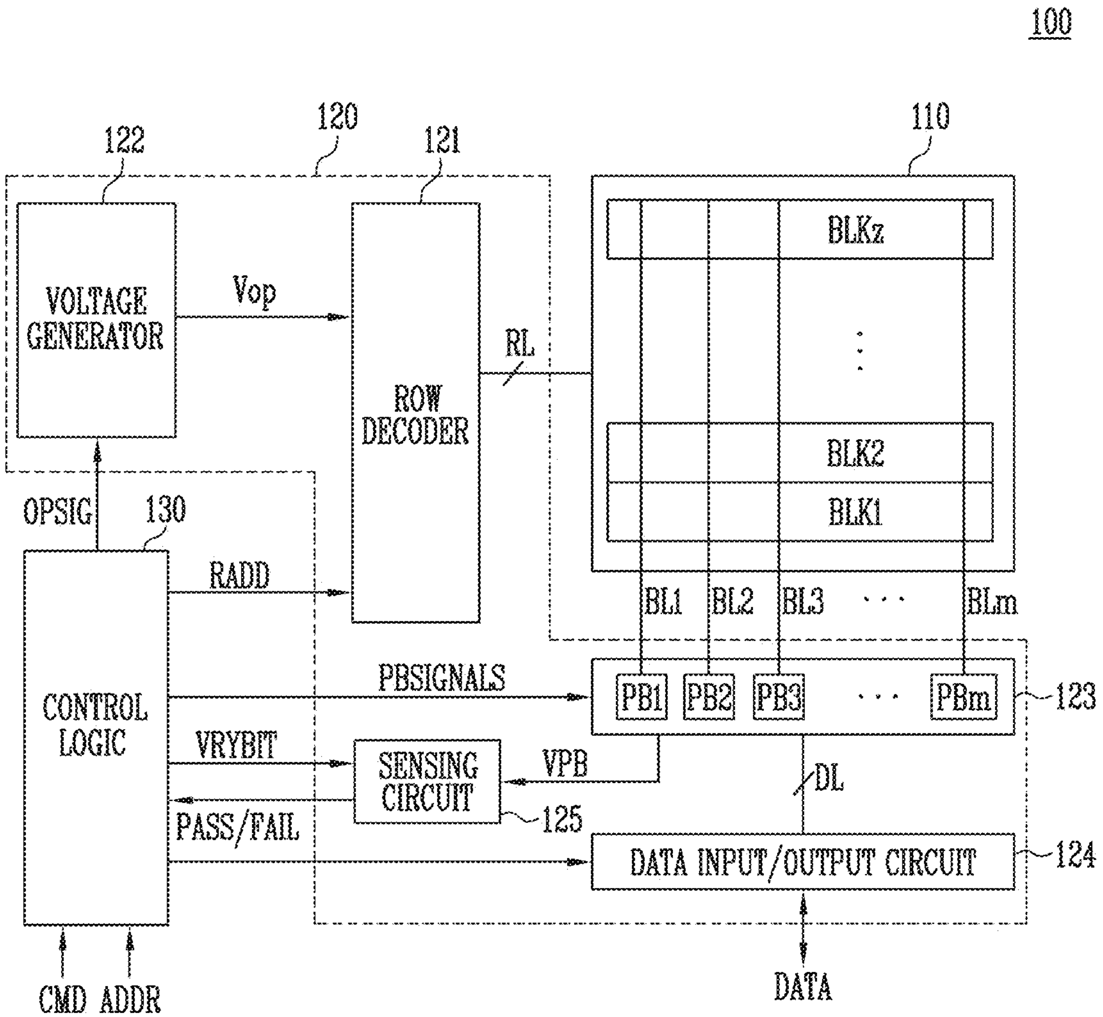
FIG. 2 is a diagram illustrating a structure of a memory device of FIG. 1.

FIG. 2 is a diagram illustrating a structure of the memory device of FIG. 1.

Referring to FIG. 2, the memory device 100 may include a memory cell array 110, a peripheral circuit 120, and a control logic 130.

The memory cell array 110 may include a plurality of memory blocks BLK1 to BLKz. The plurality of memory blocks BLK1 to BLKz may be connected to a row decoder 121 through row lines RL. The plurality of memory blocks BLK1 to BLKz may be connected to a read and write circuit 123 through bit lines BL1 to BLm. Each of the plurality of memory blocks BLK1 to BLKz may include a plurality of memory cells. In an embodiment, the plurality of memory cells may be nonvolatile memory cells. Memory cells that are connected to the same word line among the plurality of memory cells may be defined as one physical page. That is, the memory cell array 110 may be configured of a plurality of pages.

Each of the memory cells of the memory device 100 may be configured as a single level cell (SLC) that stores one data bit, a multi-level cell (MLC) that stores two data bits, a triple level cell (TLC) that stores three data bits, or a quad level cell (QLC) that stores four data bits.

The peripheral circuit 120 may include the row decoder 121, a voltage generator 122, the read and write circuit 123, a data input/output circuit 124, and a sensing circuit 125.

The peripheral circuit 120 may drive the memory cell array 110. For example, the peripheral circuit 120 may drive the memory cell array 110 to perform a program operation, a read operation, and an erase operation.

The row decoder 121 may be connected to the memory cell array 110 through row lines RL. The row lines RL may include at least one source select line, a plurality of word lines, and at least one drain select line. In an embodiment, the word lines may include normal word lines and dummy word lines.

The row decoder 121 may be configured to decode a row address RADD received from the control logic 130. The row decoder 121 may select at least one memory block, among the memory blocks BLK1 to BLKz, according to the decoded address. In addition, the row decoder 121 may select at least one word line of the selected memory block to apply voltages that are generated by the voltage generator 122 to the at least one word line according to the decoded address.

For example, during the program operation, the row decoder 121 may apply a program voltage to the selected word line and a program pass voltage that has a lower voltage level than the program voltage to unselected word lines. During a program verify operation, the row decoder 121 may apply a verify voltage to the selected word line and apply a verify pass voltage that has a higher voltage level than the verify voltage to the unselected word lines. During the read operation, the row decoder 121 may apply a read voltage to the selected word line and apply a read pass voltage that has a higher voltage level than the read voltage to the unselected word lines.

In an embodiment, the erase operation of the memory device 100 may be performed in a memory block unit. During the erase operation, the row decoder 121 may select one memory block according to the decoded address. During the erase operation, the row decoder 121 may apply a ground voltage to word lines that are connected to the selected memory block.

During the read operation, the row decoder 121 may apply a read voltage to the selected word line and apply a read pass voltage that has a higher voltage level than the read voltage to the unselected word lines.

According to an embodiment, the erase operation of the memory device 100 may be performed in the memory block unit. An address ADDR that is input to the memory device 100 during the erase operation may include a block address. The row decoder 121 may decode the block address and select one memory block according to the decoded block address. During the erase operation, the row decoder 121 may apply a ground voltage to word lines that are input to the selected memory block.

The voltage generator 122 may be configured to generate a plurality of voltages by using an external power voltage that is supplied to the memory device 100. The voltage generator 122 may operate in response to the control logic 130.

In an embodiment, the voltage generator 122 may generate an internal power voltage by regulating the external power voltage. The internal power voltage that is generated by the voltage generator 122 may be used as an operation voltage of the memory device 100.

In an embodiment, the voltage generator 122 may generate the plurality of voltages that are used for the external power voltage or the internal power voltage. The voltage generator 122 may be configured to generate various voltages that are required by the memory device 100. For example, the voltage generator 122 may generate a plurality of erase voltages, a plurality of program voltages, a plurality of pass voltages, a plurality of selection read voltages, and a plurality of non-selection read voltages.

In order to generate the plurality of voltages having various voltage levels, the voltage generator 122 may include a plurality of pumping capacitors that receive the internal voltage and may selectively activate the plurality of pumping capacitors in response to the control logic 130 to generate the plurality of voltages.

The plurality of generated voltages may be supplied to the memory cell array 110 by the row decoder 121.

The read and write circuit 123 may include first to m-th page buffers PB1 to PBm. The first to m-th page buffers PB1 to PBm may be connected to the memory cell array 110 through first to m-th bit lines BL1 to BLm, respectively. The first to m-th page buffers PB1 to PBm may operate in response to the control logic 130.

The first to m-th page buffers PB1 to PBm may communicate with the data input/output circuit 124 by outputting and receiving data DATA to/from the data input/output circuit 124. During a program operation, the first to m-th page buffers PB1 to PBm may receive the data DATA through the data input/output circuit 124 and data lines DL to be stored therein.

During the program operation, when a program pulse is applied to the selected word line, the first to m-th page buffers PB1 to PBm may transfer the data DATA, received through the data input/output circuit 124, to the selected memory cells through the bit lines BL1 to BLm. The memory cells of the selected page may be programmed according to the transferred data DATA. A memory cell that is connected to a bit line to which a program allowable voltage (for example, a ground voltage) is applied may have an increased threshold voltage. A threshold voltage of a memory cell that is connected to a bit line to which a program inhibition voltage (for example, a power voltage) is applied may be maintained. During the program verify operation, the first to m-th page buffers PB1 to PBm may read the data DATA that is stored in the memory cells from the selected memory cells through the bit lines BL1 to BLm.

During the read operation, the read and write circuit 123 may read the data DATA from the memory cells of the selected page through the bit lines BL1 to BLm and may store the read data DATA in the first to m-th page buffers PB1 to PBm.

During the erase operation, the read and write circuit 123 may float the bit lines BL1 to BLm. In an embodiment, the read and write circuit 123 may include a column select circuit.

The data input/output circuit 124 may be connected to the first to m-th page buffers PB1 to PBm through the data lines DL. The data input/output circuit 124 may operate in response to the control logic 130.

The data input/output circuit 124 may include a plurality of input/output buffers (not shown) that receive input data DATA. During the program operation, the data input/output circuit 124 may receive the data DATA from an external controller (not shown). During the read operation, the data input/output circuit 124 may output the data DATA that is transferred from the first to m-th page buffers PB1 to PBm, included in the read and write circuit 123, to the external controller.

During the read operation or the verify operation, a sensing circuit 125 may generate a reference current in response to a signal of an allowable bit VRYBIT that is generated by the control logic 130 and may compare a sensing voltage VPB that is received from the read and write circuit 123 with a reference voltage that is generated by the reference current to output a pass signal PASS or a fail signal FAIL to the control logic 130.

In an embodiment, the sensing circuit 125 may include a current sensing circuit that counts the number of fail bits, the number of fail bits being the number of program-failed cells among target cells.

The control logic 130 may be connected to the row decoder 121, the voltage generator 122, the read and write circuit 123, the data input/output circuit 124, and the sensing circuit 125. The control logic 130 may be configured to control all operations of the memory device 100. The control logic 130 may operate in response to a command CMD that is transferred from an external device.

The control logic 130 may generate various signals in response to the command CMD and the address ADDR to control the peripheral circuit 120. For example, the control logic 130 may generate an operation signal OPSIG, the row address RADD, a read and write circuit control signal PBSIGNALS, and the allowable bit VRYBIT in response to the command CMD and the address ADDR. The control logic 130 may output the operation signal OPSIG to the voltage generator 122, output the row address RADD to the row decoder 121, output the read and write circuit control signal PBSIGNALS to the read and write circuit 123, and output the allowable bit VRYBIT to the sensing circuit 125. In addition, the control logic 130 may determine whether the verify operation has passed or failed in response to the pass signal PASS or the fail signal FAIL that is output by the sensing circuit 125.

In an embodiment, the control logic 130 may receive a program command from the memory controller. The control logic 130 may control the peripheral circuit 120 so that the memory device 100 performs a program operation including a plurality of program loops on memory cells that are connected to the selected word line in response to the program command that is received from the memory controller. The control logic 130 may apply a program voltage to the selected word line in each loop of the program operation. In some of the plurality of loops of the program operation, the control logic 130 may apply the first pass voltage to adjacent word lines that are adjacent to the selected word line and then apply the second pass voltage having a different magnitude compared to the first pass voltage at a predetermined time point. In the rest of the plurality of loops of the program operation, the control logic 130 may control the peripheral circuit to apply the second pass voltage to the adjacent word lines at a time point that is different from the predetermined time point. In other words, based on a selected loop, the loops prior to the selected loop may apply the first pass voltage and the second pass voltage at different times compared to the loops after the selected loop.

Figure 3:
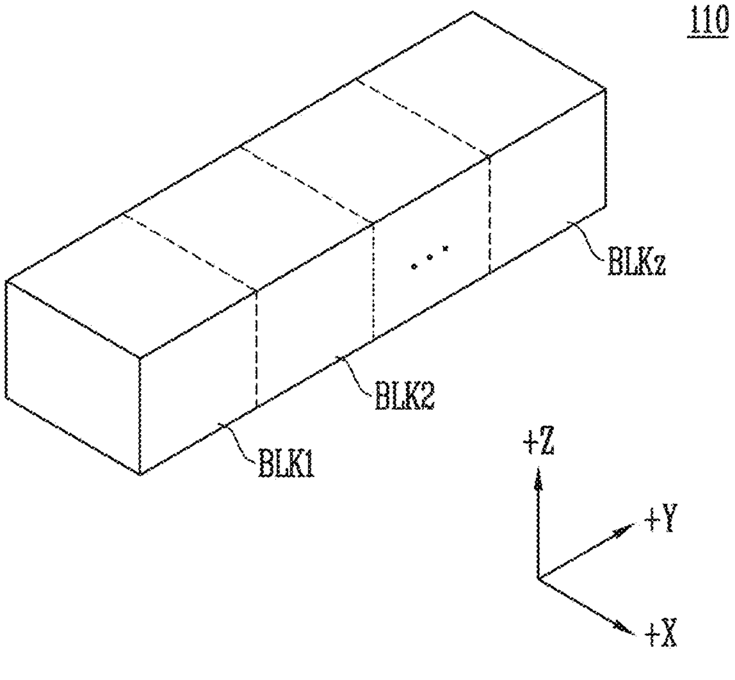
FIG. 3 is a diagram illustrating an embodiment of a memory cell array of FIG. 2.

FIG. 3 is a diagram illustrating an embodiment of the memory cell array of FIG. 2.

Referring to FIG. 3, the memory cell array 110 may include a plurality of memory blocks BLK1 to BLKz. Each memory block may have a three-dimensional structure. Each memory block may include a plurality of memory cells that are stacked on a substrate. Such plurality of memory cells may be arranged along a +X direction, a +Y direction, and a +Z direction. A structure of each memory block is described in more detail with reference to FIG. 4.

Figure 4:
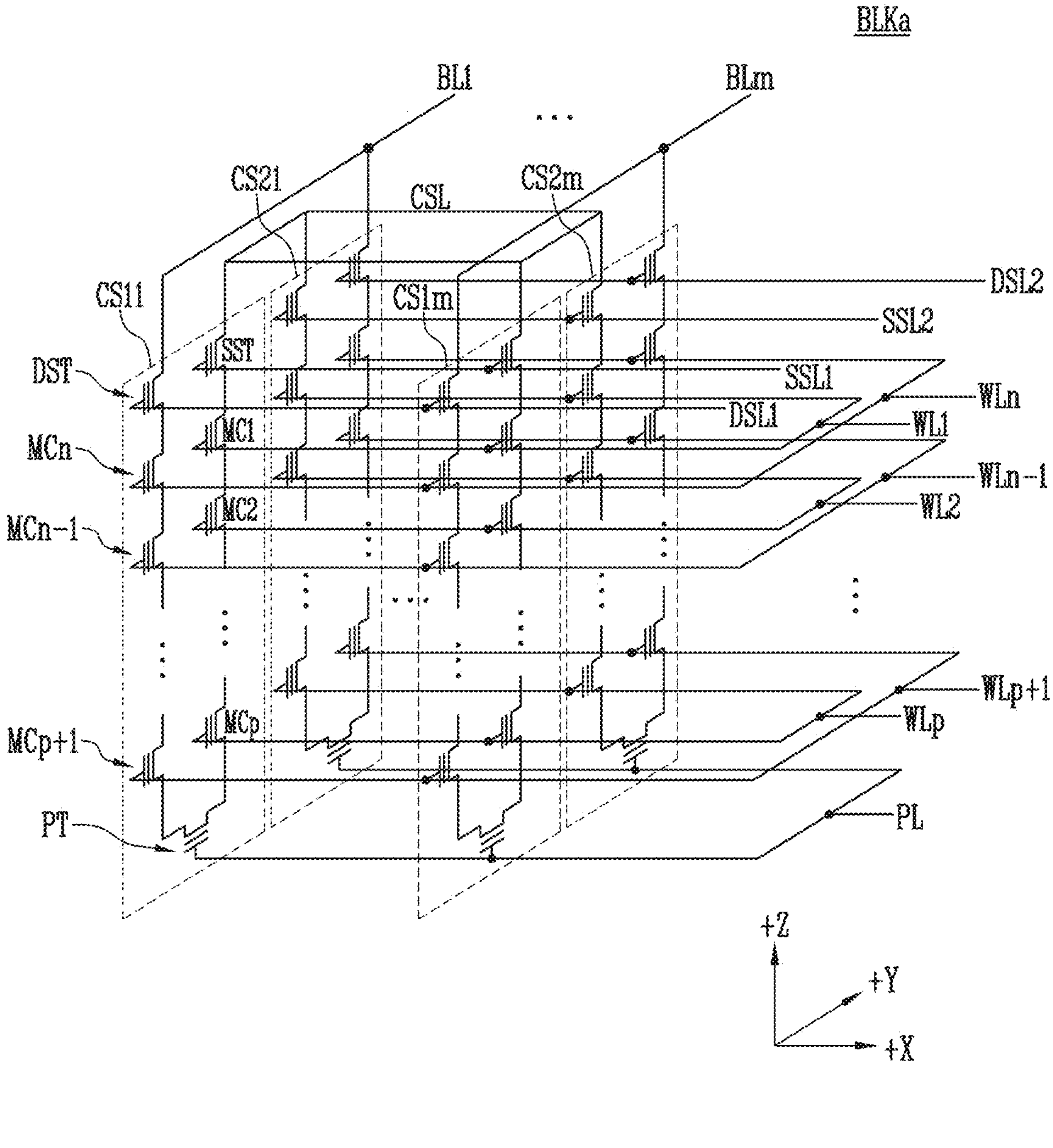
FIG. 4 is a circuit diagram illustrating any one memory block BLKa among memory blocks BLK1 to BLKz of FIG. 2.

FIG. 4 is a circuit diagram illustrating any one memory block BLKa among the memory blocks BLK1 to BLKz of FIG. 2.

Referring to FIG. 4, the memory block BLKa may include a plurality of cell strings CS11 to CS1*m* and CS21 to CS2*m*.

In an embodiment, each of the plurality of cell strings CS11 to CS1*m* and CS21 to CS2*m* may be formed in a 'U' shape. In the memory block BLKa, m cell strings may be arranged in a row direction (that is, the +X direction). In FIG. 4, two cell strings may be arranged in a column direction (that is, the +Y direction). However, this is for convenience of description and it may be understood that three or more cell strings may be arranged in the column direction.

Each of the plurality of cell strings CS11 to CS1*m* and CS21 to CS2*m* may include at least one source select transistor SST, first to n-th memory cells MC1 to MCn, a pipe transistor PT, and at least one drain select transistor DST.

Each of the select transistors SST and DST and the memory cells MC1 to MCn may have a similar structure. In an embodiment, each of the select transistors SST and DST and the memory cells MC1 to MCn may include a channel layer, a tunneling insulating film, a charge storage film, and a blocking insulating film. In an embodiment, a pillar for providing the channel layer may be provided in each cell string. In an embodiment, a pillar for providing at least one of the channel layer, the tunneling insulating film, the charge storage film, and the blocking insulating film may be provided in each cell string.

The source select transistor SST of each cell string may be connected between a common source line CSL and the memory cells MC1 to MCp.

In an embodiment, the source select transistors of the cell strings that are arranged in the same row may be connected to a source select line that extends in the row direction, and the source select transistors of the cell strings that are arranged in different rows may be connected to different source select lines. In FIG. 4, the source select transistors of the cell strings CS11 to CS1*m* of a first row may be connected to a first source select line SSL1. The source select transistors of the cell strings CS21 to CS2*m* of a second row may be connected to a second source select line SSL2.

In another embodiment, the source select transistors of the cell strings CS11 to CS1*m* and CS21 to CS2*m* may be commonly connected to one source select line.

The first to n-th memory cells MC1 to MCn of each cell string may be connected between the source select transistor SST and the drain select transistor DST.

The first to n-th memory cells MC1 to MCn may be divided into first to p-th memory cells MC1 to MCp and (p+1)-th to n-th memory cells MCp+1 to MCn. The first to p-th memory cells MC1 to MCp may be sequentially arranged in a direction that is opposite to the +Z direction and may be connected in series between the source select transistor SST and the pipe transistor PT. The (p+1)-th to n-th memory cells MCp+1 to MCn may be sequentially arranged in the +Z direction and may be connected in series between the pipe transistor PT and the drain select transistor DST. The first to p-th memory cells MC1 to MCp and the (p+1)-th to n-th memory cells MCp+1 to MCn may be connected to each other through the pipe transistor PT. Gates of the first to n-th memory cells MC1 to MCn of each cell string may be connected to the first to n-th word lines WL1 to WLn, respectively.

A gate of the pipe transistor PT of each cell string may be connected to a pipeline PL.

The drain select transistor DST of each cell string may be connected between a corresponding bit line and the memory cells MCp+1 to MCn. The cell strings that are arranged in the row direction may be connected to the drain select line that extends in the row direction. The drain select transistors of the cell strings CS11 to CS1*m* of the first row may be connected to a first drain select line DSL1. The drain select transistors of the cell strings CS21 to CS2*m* of the second row may be connected to a second drain select line DSL2.

The cell strings that are arranged in the column direction may be connected to the bit lines that extend in the column direction. In FIG. 4, the cell strings CS11 and CS21 of the first column may be connected to the first bit line BL1. The cell strings CS1*m* and CS2*m* of the m-th column may be connected to the m-th bit line BLm.

The memory cells that are connected to the same word line in the cell strings that are arranged in the row direction configure one page. For example, the memory cells that are connected to the first word line WL1, among the cell strings CS11 to CS1*m* of the first row, may configure one page. The memory cells that are connected to the first word line WL1, among the cell strings CS21 to CS2*m* of the second row, may configure another page. The cell strings that are arranged in one row direction may be selected by selecting any one of the drain select lines DSL1 and DSL2. One page of the selected cell strings may be selected by selecting any one of the word lines WL1 to WLn.

Figure 5:
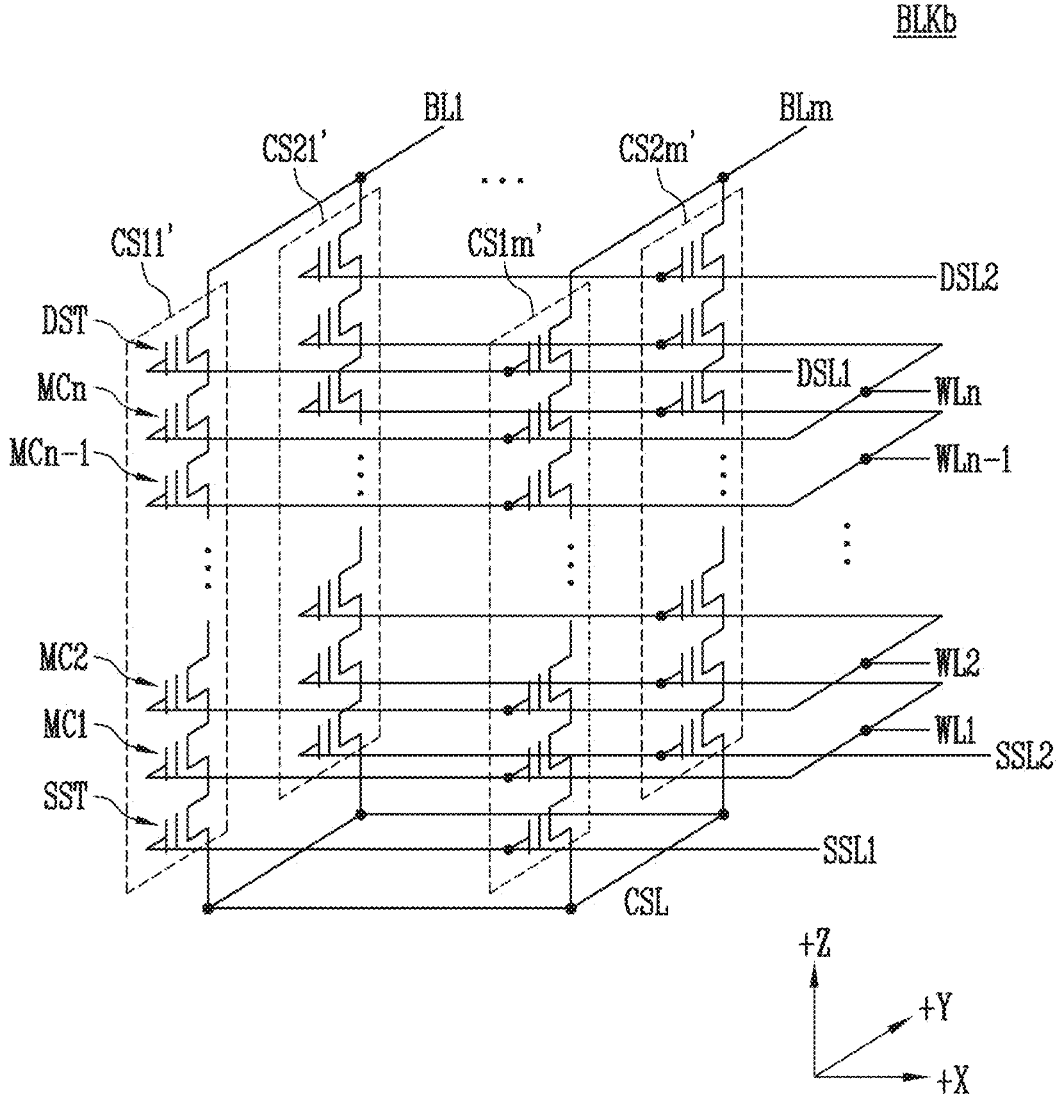
FIG. 5 is a circuit diagram illustrating another embodiment of any one memory block BLKb among the memory blocks BLK1 to BLKz of FIG. 2.

FIG. 5 is a circuit diagram illustrating another embodiment of any one memory block BLKb among the memory blocks BLK1 to BLKz of FIG. 2.

In another embodiment, even bit lines and odd bit lines may be provided instead of the first to m-th bit lines BL1 to BLm. In addition, even-numbered cell strings, among the cell strings CS11 to CS1*m* or CS21 to SC2*m* that are arranged in the row direction, may be connected to the even bit lines, and odd-numbered cell strings, among the cell strings CS11 to CS1*m* or CS21 to CS2*m* that are arranged in the row direction, may be connected to odd bit lines, respectively.

In an embodiment, at least one of the first to n-th memory cells MC1 to MCn may be used as a dummy memory cell. For example, at least one dummy memory cell may be provided to reduce an electric field between the source select transistor SST and the memory cells MC1 to MCp. Alternatively, at least one dummy memory cell may be provided to reduce an electric field between the drain select transistor DST and the memory cells MCp+1 to MCn. As more dummy memory cells are provided, while the reliability of operations on the memory block BLKb may improve, the size of the memory block BLKb increases. As less memory cells are provided, while the size of the memory block BLKb may decrease, the reliability of the operation on the memory block BLKb may decrease.

In order to efficiently control at least one dummy memory cell, each of the dummy memory cells may have a required threshold voltage. Before or after an erase operation on the memory block BLKb, program operations for all or a part of the dummy memory cells may be performed. When the erase operation is performed after the program operation is performed, the dummy memory cells may have the required threshold voltage by controlling a voltage that is applied to the dummy word lines that are connected to the respective dummy memory cells.

Figure 6:
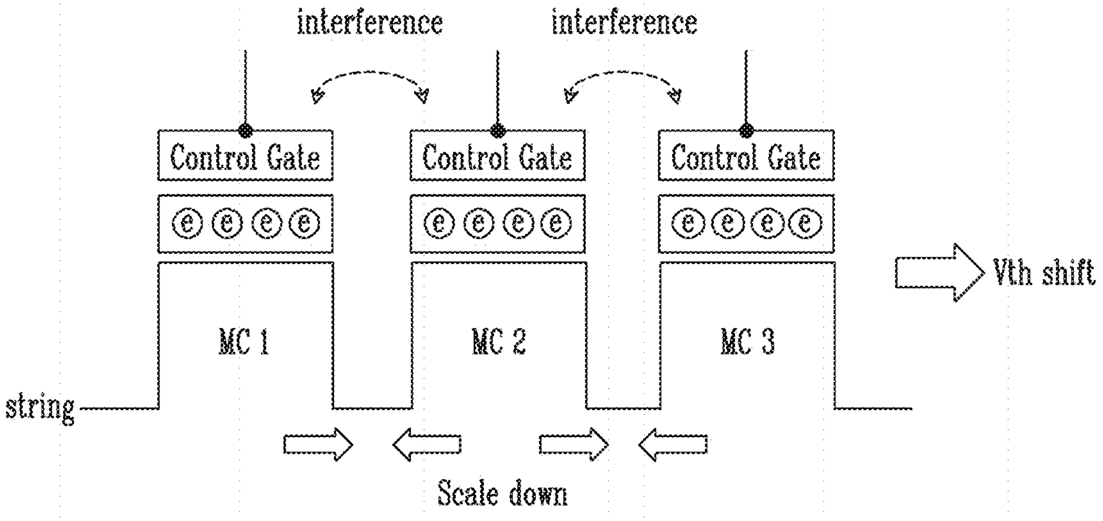
FIG. 6 is a diagram illustrating an example of an interference phenomenon between adjacent memory cells.

FIG. 6 is a diagram illustrating an example of an interference phenomenon between adjacent memory cells.

Referring to FIG. 6, when a plurality of programmed memory cells are adjacent to each other, threshold voltages of the memory cells may move due to interference between the adjacent memory cells. Referring to FIG. 6 as an example, a first memory cell MC 1, a second memory cell MC 2, and a third memory cell MC 3 may be connected to one string. At this time, a threshold voltage of the first memory cell MC 1 may move due to interference with the second memory cell MC 2. A threshold voltage of the second memory cell MC 2 may move due to interference with the first memory cell MC 1 or the third memory cell MC 3. A threshold voltage of the third memory cell MC 3 may move due to interference with the second memory cell MC 2. As technology is developed, as the number of memory cells that are integrated in a limited area increases, the distance between adjacent memory cells may become narrower. As the distance between the adjacent memory cells become narrower, a phenomenon in which a threshold voltage distribution of a plurality of memory cells deteriorates due to interference with adjacent memory cells may become more severe.

Figure 7A:
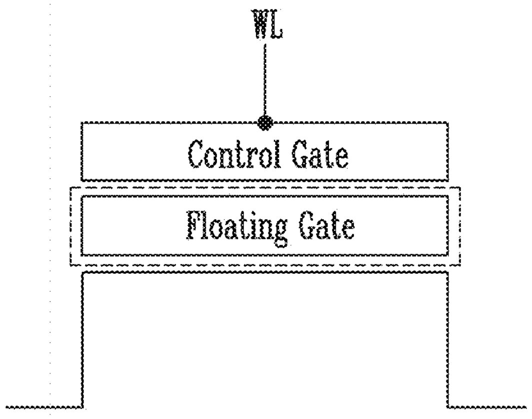
FIGS. 7A-7C are diagrams illustrating a distribution of charges that are trapped inside a floating gate of a programmed memory cell.
Figure 7B:
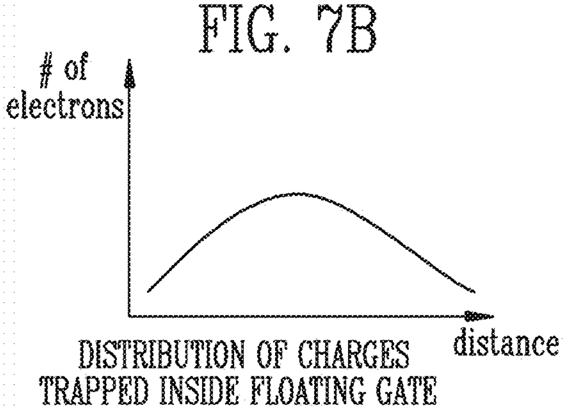
Figure 7C:
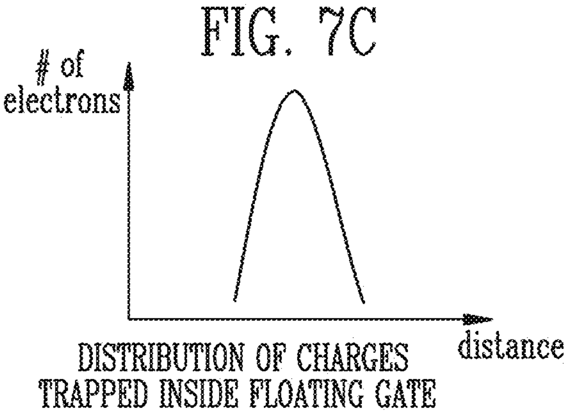

FIGS. 7A-7C are diagrams illustrating a distribution of charges that are trapped inside a floating gate of a programmed memory cell.

FIG. 7A schematically illustrates a structure of any one memory cell, among the plurality of memory cells, shown in FIGS. 4 and 5. Referring to FIG. 7A, a gate of the memory cell may include a control gate Control Gate and a floating gate Floating Gate. The control gate Control Gate may be connected to the word line WL. When the memory device performs the program operation on the memory cell, the program voltage may be applied to the control gate Control Gate through the word line WL. When the program voltage is applied to the control gate Control Gate in the program operation on the memory cell, a plurality of charges may be trapped inside the floating gate Floating Gate. As the number of charges that are trapped in the memory cell increases, the threshold voltage of the memory cell may increase. FIGS. 7B and 7C illustrate an example of a distribution of the charges that are trapped inside the floating gate Floating Gate. Referring to FIG. 7B, the trapped charges may form a Gaussian-shaped distribution that increases from both ends to a center of the floating gate. Referring to FIG. 7C, the amount of trapped charges may be greater in the middle portion of the floating gate and less in both end portions compared to the distribution of trapped charges in FIG. 7B. As the amount of trapped charges existing at the both end portions of the floating gate Floating Gate increases, the influence on the threshold voltage of the memory cell by interference, described with reference to FIG. 6, may be greater.

In an embodiment, the structure of the memory cell including the control gate Control Gate and the floating gate Floating Gate is described as an example, but the present disclosure is not limited by the embodiment. For example, the memory cell, according to an embodiment, may have a structure in which the floating gate Floating Gate is omitted. A type of a film in which the plurality of charges are trapped may exist in various forms. For convenience of description, a 2D memory cell structure is described as an example, but the present disclosure is not limited thereto and may be applied to a 3D or 4D memory cell structure.

Figure 8:
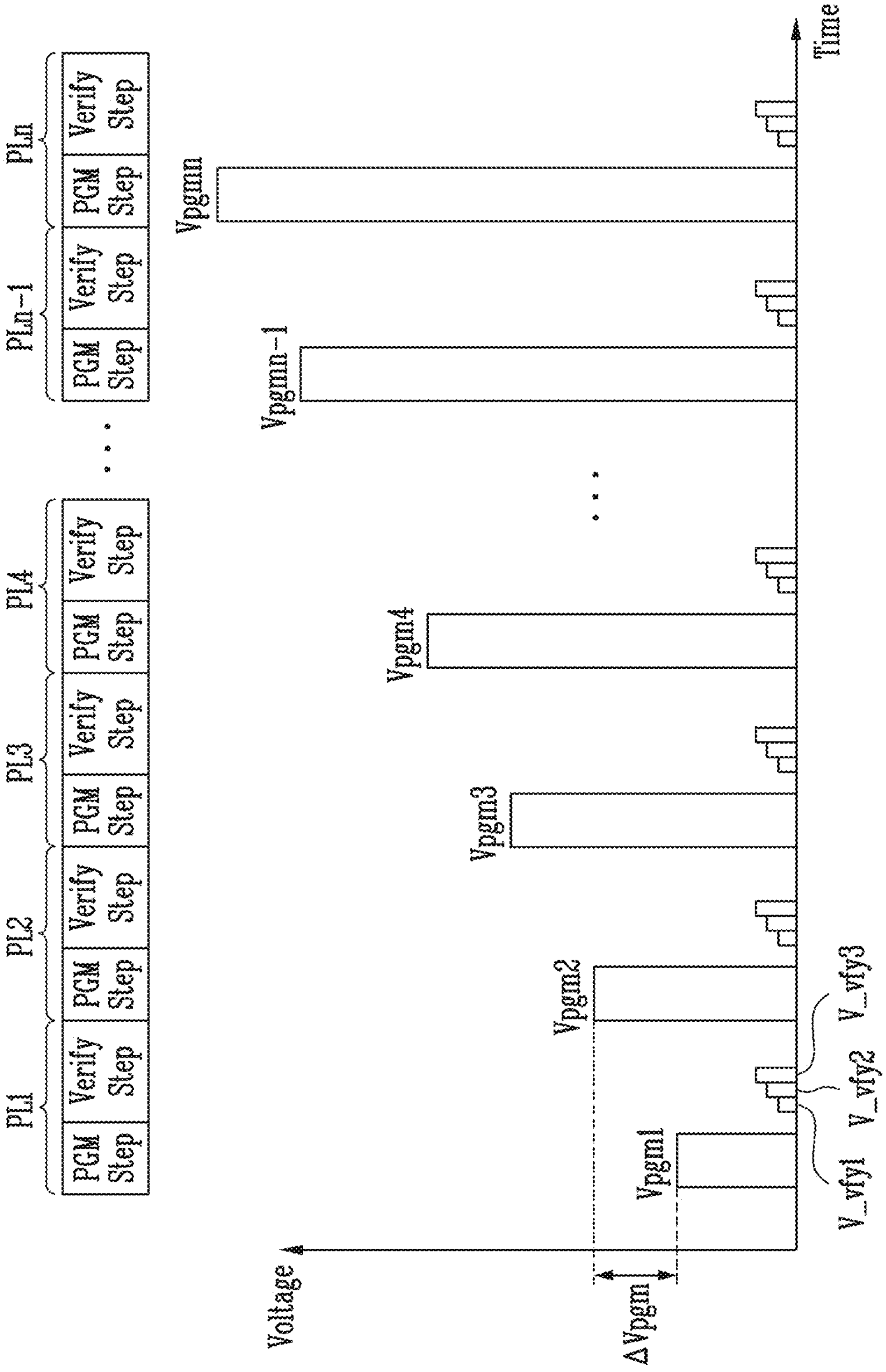
FIG. 8 is a diagram illustrating a program operation according to an embodiment.

FIG. 8 is a diagram illustrating a program operation according to an embodiment.

Referring to FIG. 8, the program operation may include a plurality of program loops PL1 to PLn. The memory device may perform the plurality of program loops PL1 to PLn to program the selected memory cells to have any one program state among a plurality of program states.

Each of the plurality of program loops PL1 to PLn may include a program voltage apply step PGM Step of applying the program voltage and a verify step Verify Step of determining whether the memory cells are programmed by applying verify voltages.

In the program voltage apply step, a program voltage apply operation of applying the program voltage to the selected word line that is connected to the selected memory cells may be performed. The selected memory cells may be programmed to any one program state, among first to n-th (n is a natural number) state, by the program voltage apply operation.

In an embodiment, the program voltage may be determined according to an incremental step pulse programming (ISPP) method. That is, the level of the program voltage may increase or decrease in a stepwise manner by a step voltage as the program loops are repeated. The application number, a voltage level, a voltage application time, and the like of the program voltages that are used in each program loop may be determined in various forms according to the memory controller.

The pass voltage may be applied to the unselected word lines that are word lines other than the selected word line. In an embodiment, pass voltages having the same level may be applied to the unselected word lines. In an embodiment, the pass voltage may have different levels according to the position of the word line.

A ground voltage may be applied as the program allowable voltage to the selected bit lines that are connected to the memory cell to be programmed. The program inhibition voltage may be applied to unselected bit lines that are bit lines that are connected to memory cells other than the memory cells to be programmed.

In the program verify step, the memory device may apply the verify voltage to the selected word line and may apply the verify pass voltage to the unselected word lines. The memory device may sense a voltage or a current that is output through the bit lines to which the memory cells that are connected to the selected word line are respectively connected and may determine whether the verify step has passed or failed based on a sensed result.

In the verify step, the program verify operation may be performed on at least one program state, among the first to n-th program states. For example, when memory cells to be programmed to a k-th (k is a natural number equal to or greater than 1 and equal to or less than n) state are read as off-cells by the verify voltage that corresponds to the k-th state, the program verify operation on the k-th state may pass.

In FIG. 8, when the selected memory cells are MLCs that store two data bits, the selected memory cells may be programmed to any one program state, among an erase state and first to third program states. The number of data bits that are stored in the memory cell is not limited to the present embodiment.

When the first program loop PL1 is performed, after a first program voltage Vpgm1 is applied, first to third verify voltages V_vfy1 to V_vfy3 may be sequentially applied to verify the program state of the plurality of memory cells. At this time, memory cells of which a target state is a first program state may be verified by the first verify voltage V_vfy1, memory cells of which a target state is a second program state may be verified by the second verify voltage V_vfy2, and memory cells of which a target state is a third program state may be verified by the third verify voltage V_vfy3. The number of verify voltages is not limited to the present embodiment.

The memory cells that have been verified to have passed based on each of the verify voltages V_vfy1 to V_vfy3 may be determined to have the target state and then may be program-inhibited in a second program loop PL2. The program inhibition voltage may be applied to a bit line that is connected to the program-inhibited memory cells. A second program voltage Vpgm2, which is higher than the first program voltage Vpgm1 by a unit voltage ΔVpgm, may be applied to the selected word line in the second program loop PL2.

Thereafter, the verify operation of the second program loop PL2 may be performed identically to the verify operation of the first program loop PL1. For example, a verify pass may indicate that a memory cell is read as an off-cell by a corresponding verify voltage.

As described above, when the memory device programs the MLC, the memory device may verify the memory cells having the respective program states as the target states by using the first to third verify voltages V_vfy1 to V_vfy3.

Figure 9:
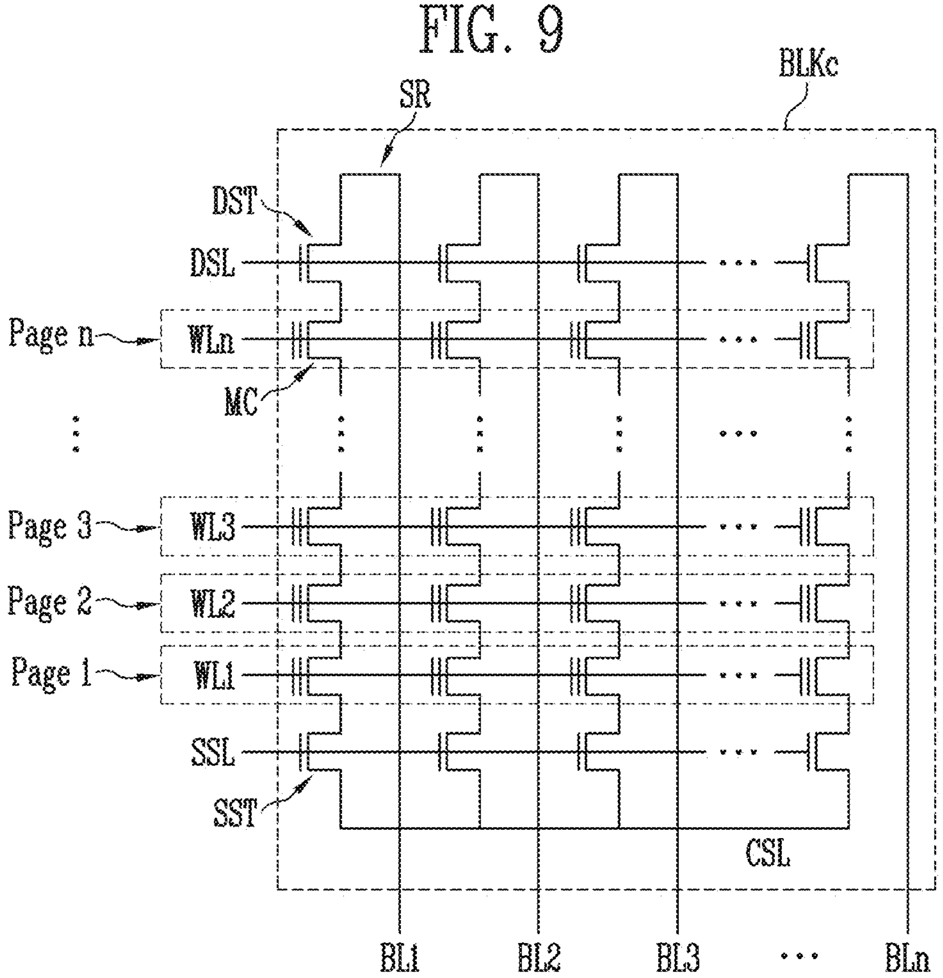
FIG. 9 is a circuit diagram illustrating another embodiment of any one memory block BLKc among the memory blocks BLK1 to BLKz of FIG. 2.

FIG. 9 is a circuit diagram illustrating another embodiment of any one memory block BLKc among the memory blocks BLK1 to BLKz of FIG. 2.

Referring to FIG. 9, the memory block BLKc may include a plurality of strings SR. The plurality of strings SR may be connected to a plurality of bit lines BL1 to BLn, respectively. Each string SR may include a source select transistor SST, memory cells MC, and a drain select transistor DST. The source select transistor SST of each string SR may be connected between the memory cells MC and the common source line CSL. The source select transistors SST of the plurality of strings SR may be commonly connected to the common source line CSL. The drain select transistor DST of each string SR may be connected between the memory cells MC and the bit line BL. The drain select transistors DST of the plurality of strings SR may be connected to the plurality of bit lines BL1 to BLn, respectively. In each string SR, the plurality of memory cells MC may be provided between the source select transistor SST and the drain select transistor DST. In each string SR, the plurality of memory cells MC may be connected in series. In the plurality of strings SR, the memory cells MC that are positioned in the same order from the common source line CSL may be commonly connected to one word line. The memory cells MC of the plurality of strings SR may be connected to the plurality of word lines WL1 to WLn.

Memory cells that are connected to the same word line in the plurality of strings SR that are arranged in a row direction may configure one page Page. For example, in the plurality of strings SR, memory cells that are connected to a first word line WL1 may configure a first page Page 1. Memory cells that are connected to a second word line WL2 may configure a second page Page 2. Memory cells that are connected to a third word line WL3 may configure a third page Page 3. Memory cells that are connected to an n-th word line WLn may configure an n-th page Page n.

The memory device may perform the program operation on the selected memory cells in response to the program command that is provided from the memory controller. The program operation may be performed in a page unit that corresponds to each of the word lines WL1 to WLn.

Figure 10:
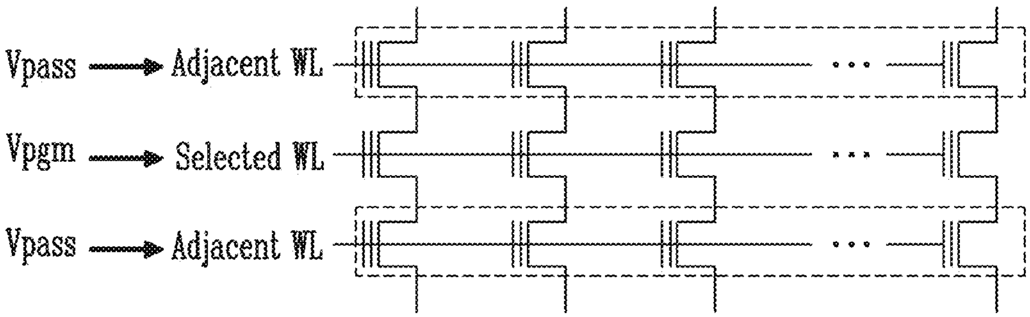
FIG. 10 is a diagram illustrating a voltage applied to a selected word line and word lines adjacent to the selected word line in a program operation.

FIG. 10 is a diagram illustrating a voltage applied to a selected word line and word lines adjacent to the selected word line in a program operation.

Referring to FIG. 10, a selected word line Selected WL may mean a word line to which the selected memory cells are connected in order for the memory device to perform the program operation. The adjacent word line Adjacent WL may be a word line that is adjacent to the selected word line.

When the memory device performs the program operation, a program voltage Vpgm may be applied to the selected word line Selected WL. A pass voltage may be applied to the remaining unselected word lines. In an embodiment, a pass voltage Vpass including at least two steps may be applied to the adjacent word lines adjacent WL, among the unselected word lines, adjacent to the selected word line Selected WL. For example, after a first pass voltage is applied to the adjacent word lines Adjacent WL at a first time point, a second pass voltage having a different magnitude compared to the first pass voltage may then be applied at a predetermined second time point. The magnitude of the second pass voltage may be greater than that of the first pass voltage.

In an embodiment, an electric field that is formed around the selected word line may be required to be concentrated around the selected word line so that a charge distribution inside the floating gate of the selected memory cell is formed as the charge distribution, as shown in FIG. 7C, after the program operation is completed. Specifically, an electric field may be formed around the selected word line by the program voltage that is applied to the selected word line during the program operation and the pass voltage that is applied to the adjacent word lines. At this time, as the difference between the magnitude of the voltage that is applied to the selected word line and the magnitude of the voltage that is applied to the adjacent word lines increases, the electric field may be concentrated on the selected word line. When the magnitude of the pass voltage that is applied to the adjacent word lines is small, the speed at which the selected memory cell is programmed may decrease during the program operation on the selected memory cell. Therefore, a pass voltage of an appropriate magnitude is required to be selected.

Figure 11:
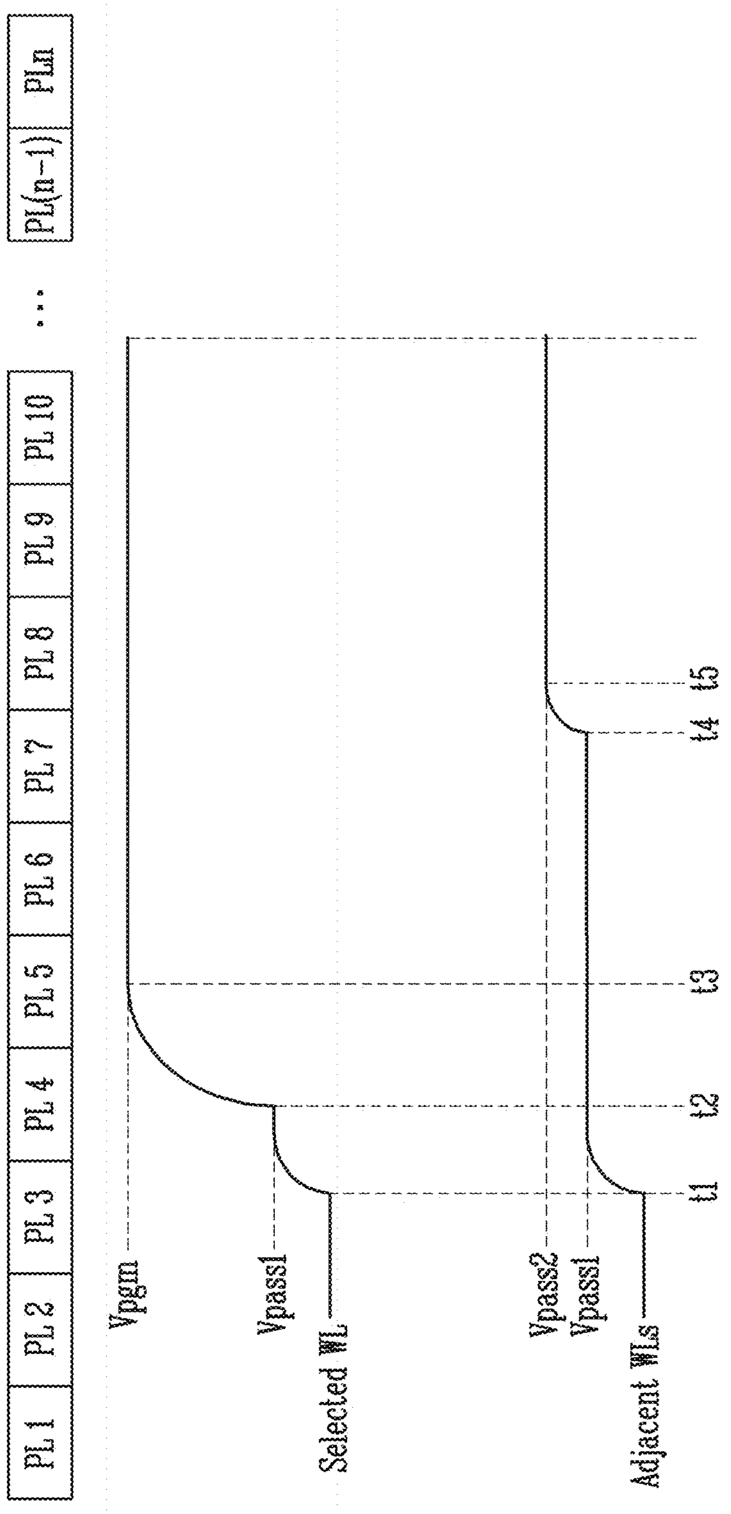
FIG. 11 is a timing diagram illustrating a voltage applied to a selected word line and word lines adjacent to the selected word line in a program operation according to time.

FIG. 11 is a timing diagram illustrating a voltage applied to a selected word line and word lines adjacent to the selected word line in a program operation according to time.

Specifically, the program operation on the selected memory cells may include a first program loop to an n-th program loop PL1 to PLn. FIG. 11 is a timing diagram illustrating a magnitude of the voltage according to time, which is applied to the selected word line Selected WL and the adjacent word lines Adjacent WLs that are adjacent to the selected word line in the program voltage apply step of a specific program loop, among the plurality of program loops, described with reference to FIG. 8.

At t1, a first pass voltage Vpass1 may be applied to the selected word line Selected WL and the adjacent word lines Adjacent WLs.

At t2, a program voltage Vpgm of a predetermined magnitude may be applied to the selected word line Selected WL. As described with reference to FIG. 8, the program voltage Vpgm may increase by a step voltage as the program loop increases.

At t3, a potential of the selected word line Selected WL may reach a level of the program voltage Vpgm.

At t4, a second pass voltage Vpass2 may be applied to the adjacent word lines Adjacent WLs. The magnitude of the second pass voltage Vpass2 may be greater than the magnitude of the first pass voltage Vpass1.

At t5, the potential of the adjacent word lines Adjacent WLs may reach the level of the second pass voltage Vpass2.

As described with reference to FIG. 11, the pass voltage may be applied to the adjacent word lines Adjacent WLs in two steps while the program voltage is applied to the selected word line Selected WL. The time point of the increase from the first pass voltage Vpass1 to the second pass voltage Vpass2 may be determined in advance.

Figure 12:
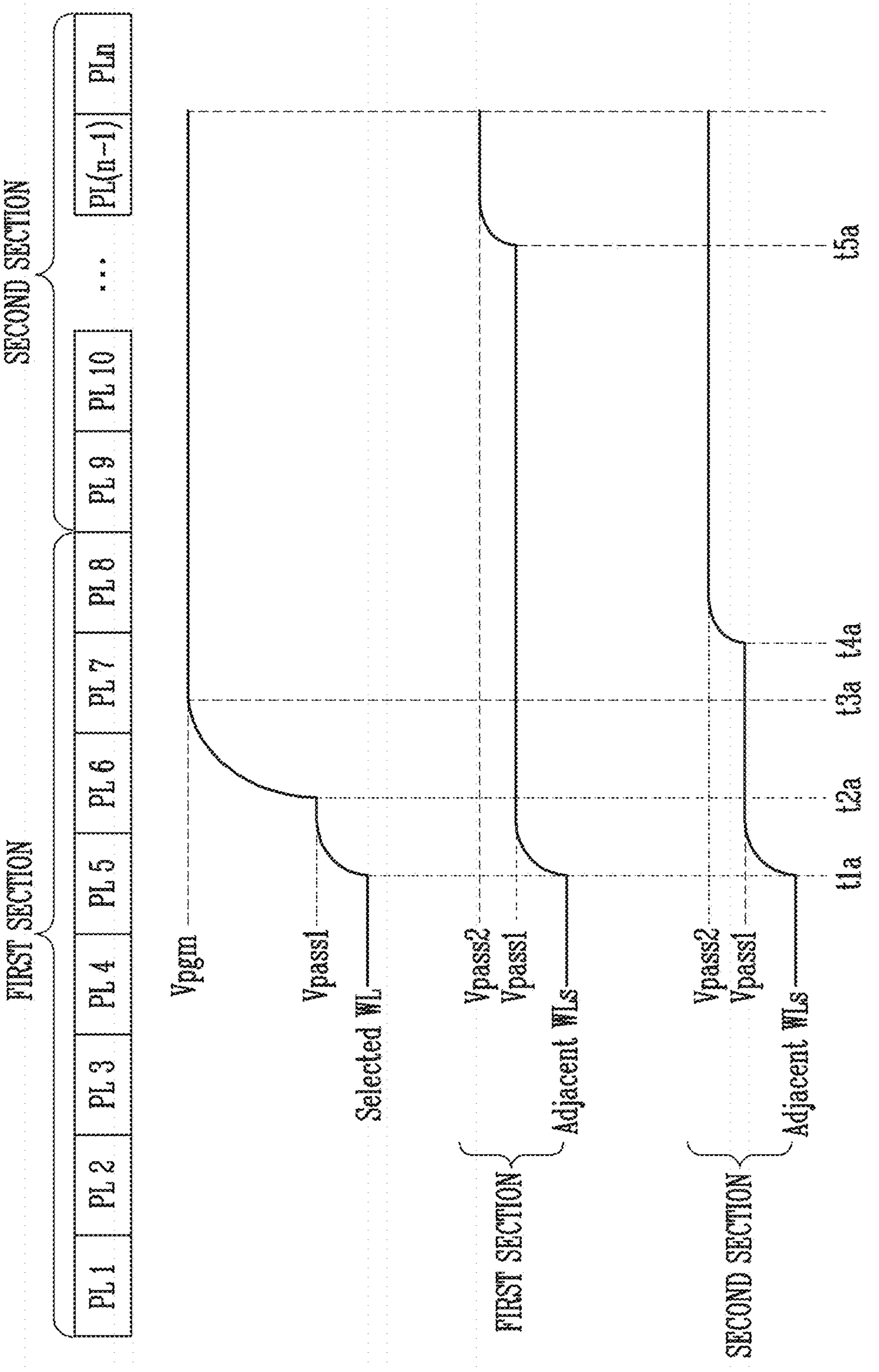
FIG. 12 is a diagram illustrating a time point at which a second pass voltage is applied in each section of a program operation according to an embodiment.

FIG. 12 is a diagram illustrating a time point at which a second pass voltage is applied in each section of a program operation according to an embodiment.

In an embodiment, the program operation on the selected memory cells may include a plurality of program loops. The plurality of program loops may be divided into a first section and a second section again. The first section may include a first program loop PL1 to an eighth program loop PL8, among the plurality of program loops. The second section may include a ninth program loop PL9 to an n-th program loop PLn, among the plurality of program loops. The n-th program loop may be a last program loop, among the plurality of program loops, included in the program operation on the selected memory cells.

In FIG. 12, the upper graph illustrates the magnitude of the voltage according to time, which is applied to the selected word line Selected WL in the plurality of program loops that are included in the first section and the second section of the program operation. The middle graph illustrates the magnitude of the voltage according to time, which is applied to the adjacent word lines Adjacent WLs in the plurality of program loops that are included in the first section. The lower graph illustrates the magnitude of the voltage according to time, which is applied to the adjacent word lines Adjacent WLs in the plurality of program loops that are included in the second section.

At t1*a*, the first pass voltage Vpass1 may be applied to the selected word line Selected WL and the adjacent word lines Adjacent WLs.

At t2*a*, the program voltage Vpgm may be applied to the selected word line Selected WL. As described with reference to FIG. 8, the program voltage Vpgm may be a voltage that increases by a predetermined step voltage as the program loop increases. Therefore, as the program loop increases, a magnitude of the program voltage Vpgm may increase.

At t3*a*, the potential of the selected word line Selected WL may reach the level of the program voltage Vpgm.

In an embodiment, the timing point at which the second pass voltage Vpass2 is applied to the adjacent word lines Adjacent WLs may vary according to a section in which an ongoing program loop is included.

When the ongoing program loop is included in the first section, the second pass voltage Vpass2 may be applied to the adjacent word lines Adjacent WLs at t5*a*. For example, in the program voltage apply step of the first program loop PL1 to the eighth program loop PL8, the time point at which the second pass voltage is applied to the adjacent word lines Adjacent WLs may be t5*a*.

When the ongoing program loop is included in the second section, the second pass voltage Vpass2 may be applied to the adjacent word lines Adjacent WLs at t4*a*. For example, in the program voltage apply step of the ninth program loop PL9 to the n-th program loop PLn, the time point at which the second pass voltage is applied to the adjacent word lines Adjacent WLs may be t4*a*.

In the program voltage apply step of the program operation, the program voltage Vpgm that is applied to the selected word line Selected WL may increase by a step voltage of a predetermined magnitude when the program loop increases. Therefore, the magnitude of the program voltage Vpgm that is applied to the selected word line Selected WL in the program loops that are included in the first section may be less than the magnitude of the program voltage Vpgm that is applied to the selected word line Selected WL in the program loops that is included in the second section.

As the difference between the magnitude of the program voltage Vpgm that is applied to the selected word line and the magnitude of the pass voltage that is applied to the adjacent word lines Adjacent WLs increases, an electric field may be concentrated on the selected word line Selected WL. Therefore, in the program loops that are included in the first section in which the magnitude of the program voltage Vpgm is relatively low, the time in which the first pass voltage Vpass1 of the magnitude that is lower than that of the second pass voltage Vpass2 is applied may be set to be longer. Conversely, in the program loops that are included in the second section in which the magnitude of the program voltage Vpgm is relatively high, the time in which the second pass voltage Vpass2 of the magnitude that is higher than that of the first pass voltage Vpass1 is applied may be set to be longer.

Figure 13:
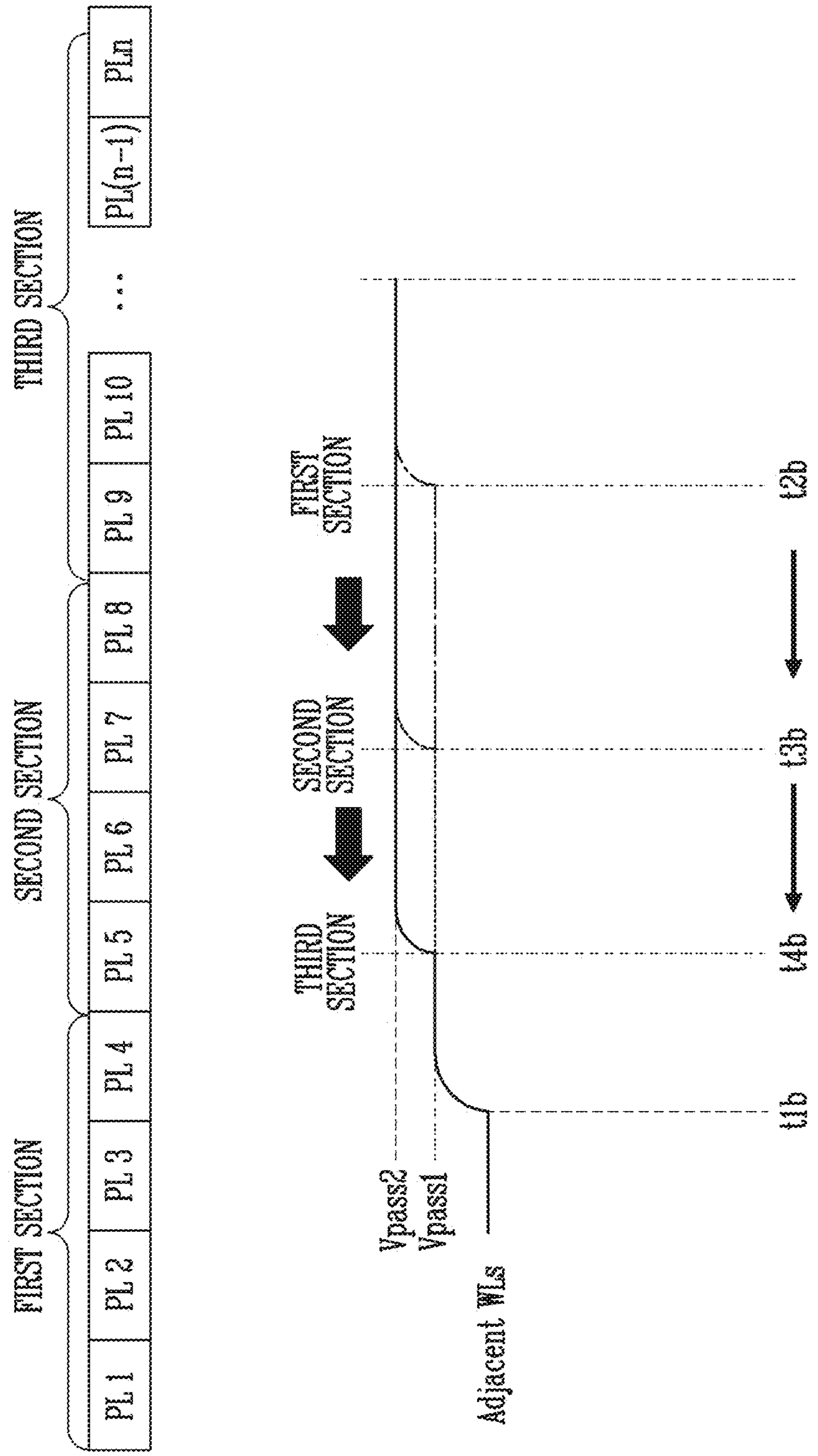
FIG. 13 is a diagram illustrating a time point at which a second pass voltage is applied in each section of a program operation according to another embodiment.

FIG. 13 is a diagram illustrating a time point at which a second pass voltage is applied in each section of a program operation according to another embodiment.

In an embodiment, the program operation on the selected memory cells may include the plurality of program loops. The plurality of program loops may be divided into a first section, a second section, and a third section again. The first section may include a first program loop PL1 to a fourth program loop PL4, among the plurality of program loops. The second section may include a fifth program loop PL5 to an eighth program loop PL8, among the plurality of program loops. The third section may include a ninth program loop PL9 to an n-th program loop PLn, among the plurality of program loops. The n-th program loop may be the last program loop, among the plurality of program loops, included in the program operation on the selected memory cells.

A graph of FIG. 13 illustrates the magnitude of the pass voltage applied to the adjacent word lines Adjacent WLs according to time in the program voltage apply step of the program loops included in each section among the three sections.

Referring to FIG. 13, in the program voltage apply step of the first program loop PL1 to the fourth program loop PL4, included in the first section, the first pass voltage Vpass1 may be applied to the adjacent word lines Adjacent WLs at t1*b*, and then the second pass voltage Vpass2 may be applied to the adjacent word lines Adjacent WLs at t2*b*.

In the program voltage apply step of the fifth program loop PL5 to the eighth program loop PL8, included in the second section, the first pass voltage Vpass1 may be applied to the adjacent word lines Adjacent WLs at t1*b*, and then the second pass voltage Vpass2 may be applied to the adjacent word lines Adjacent WLs at t3*b*.

In the program voltage apply step of the ninth program loop PL9 to the n-th program loop PLn, included in the third section, the first pass voltage Vpass1 may be applied to the adjacent word lines Adjacent WLs at t1*b*, and then the second pass voltage Vpass2 may be applied to the adjacent word lines Adjacent WLs at t4*b*.

That is, in the program operation on the selected memory cells, as the section increases, the time point at which the second pass voltage is applied to the adjacent word lines Adjacent WLs may be earlier. In other words, as the section increases, the length of time in which the first pass voltage Vpass1 is applied to the adjacent word lines Adjacent WLs may be shortened. As the section increases, the length of time in which the second pass voltage Vpass2 is applied to the adjacent word lines Adjacent WLs may become longer.

In an embodiment, as the section increases, the time point at which the second pass voltage is applied may be set to be earlier by a predetermined step time. For example, the difference between t2*b* and t3*b* may be the same as the difference between t3*b* and t4*b*.

The number of sections that are included in the plurality of program loops is not limited to the embodiment. That is, in the program operation on the selected memory cells, the plurality of program loops may be divided into four or more sections.

Figure 14:
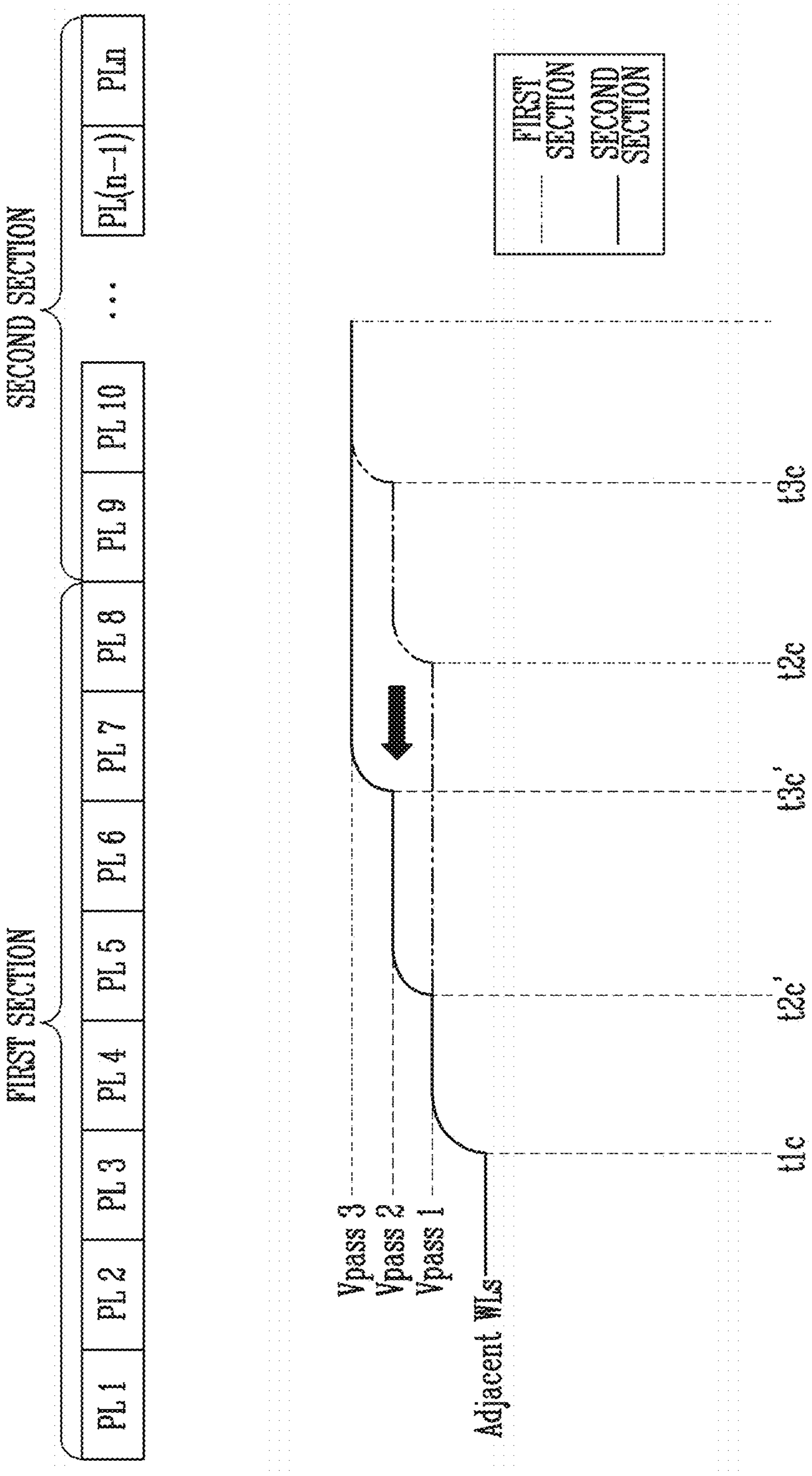
FIG. 14 is a diagram illustrating a timing point at which a second pass voltage and a third pass voltage are applied in each section of a program operation according to another embodiment.

FIG. 14 is a diagram illustrating a timing point at which a second pass voltage and a third pass voltage are applied in each section of a program operation according to another embodiment.

In an embodiment, the program operation on the selected memory cells may include the plurality of program loops. The plurality of program loops may be divided into a first section and a second section again. The first section may include a first program loop PL1 to an eighth program loop PL8, among the plurality of program loops. The second section may include a ninth program loop PL9 to an n-th program loop PLn, among the plurality of program loops. The n-th program loop may be a last program loop, among the plurality of program loops, included in the program operation on the selected memory cells.

Specifically, a graph of FIG. 14 illustrates the magnitude of the pass voltage according to time, which is applied to the adjacent word lines Adjacent WLs in the program voltage apply step of the program loops that are included in each section of the two sections. In an embodiment, the pass voltage may be applied to the adjacent word lines Adjacent WLs in three steps while the program voltage is applied to the selected word line Selected WL. The time point at which the pass voltage increases from the first pass voltage Vpass1 to the second pass voltage Vpass2 and the time point at which the pass voltage increases from the second pass voltage Vpass2 to the third pass voltage Vpass3 may be determined in advance.

Referring to FIG. 14, in the program voltage apply step of the first program loop PL1 to the eighth program loop PL8, among the plurality of program loops, included in the first section, the first pass voltage Vpass1 may be applied to the adjacent word lines Adjacent WLs at t1*c*.

After a predetermined time elapses after the first pass voltage Vpass1 is applied to the adjacent word lines Adjacent WLs at t1*c*, the second pass voltage Vpass2 may be applied at t2*c*.

After a predetermined time elapses after the second pass voltage Vpass2 is applied to the adjacent word lines Adjacent WLs at t2*c*, the third pass voltage Vpass3 may be applied at t3*c*.

In the program voltage apply step of the ninth program loop PL9 to the n-th program loop PLn, among the plurality of program loops, included in the second section, the first pass voltage Vpass1 may be applied to the adjacent word lines Adjacent WLs at t1*c*.

After a predetermined time elapses after the first pass voltage Vpass1 is applied to the adjacent word lines Adjacent WLs at t1*c*, the second pass voltage Vpass2 may be applied at t2*c'*.

After a predetermined time elapses after the second pass voltage Vpass2 is applied to the adjacent word lines Adjacent WLs at t2*c'*, the third pass voltage Vpass3 may be applied at t3*c'*.

In an embodiment, t2*c'*, which is a time point at which the second pass voltage Vpass2 is applied in the program voltage apply step of the program loops that are included in the second section, may be earlier than t2*c*, which is a time point at which the second pass voltage Vpass2 is applied in the program voltage apply step of the program loops that are included in the first section.

In an embodiment, t3*c'*, which is a time point at which the third pass voltage Vpass3 is applied in the program voltage apply step of the program loops that are included in the second section, may be earlier than t3*c*, which is a time point at which the third pass voltage Vpass3 is applied in the program voltage apply step of the program loops that are included in the first section.

The number of steps of the pass voltage that is applied to the adjacent word lines Adjacent WLs is not limited to the embodiment.

Figure 15:
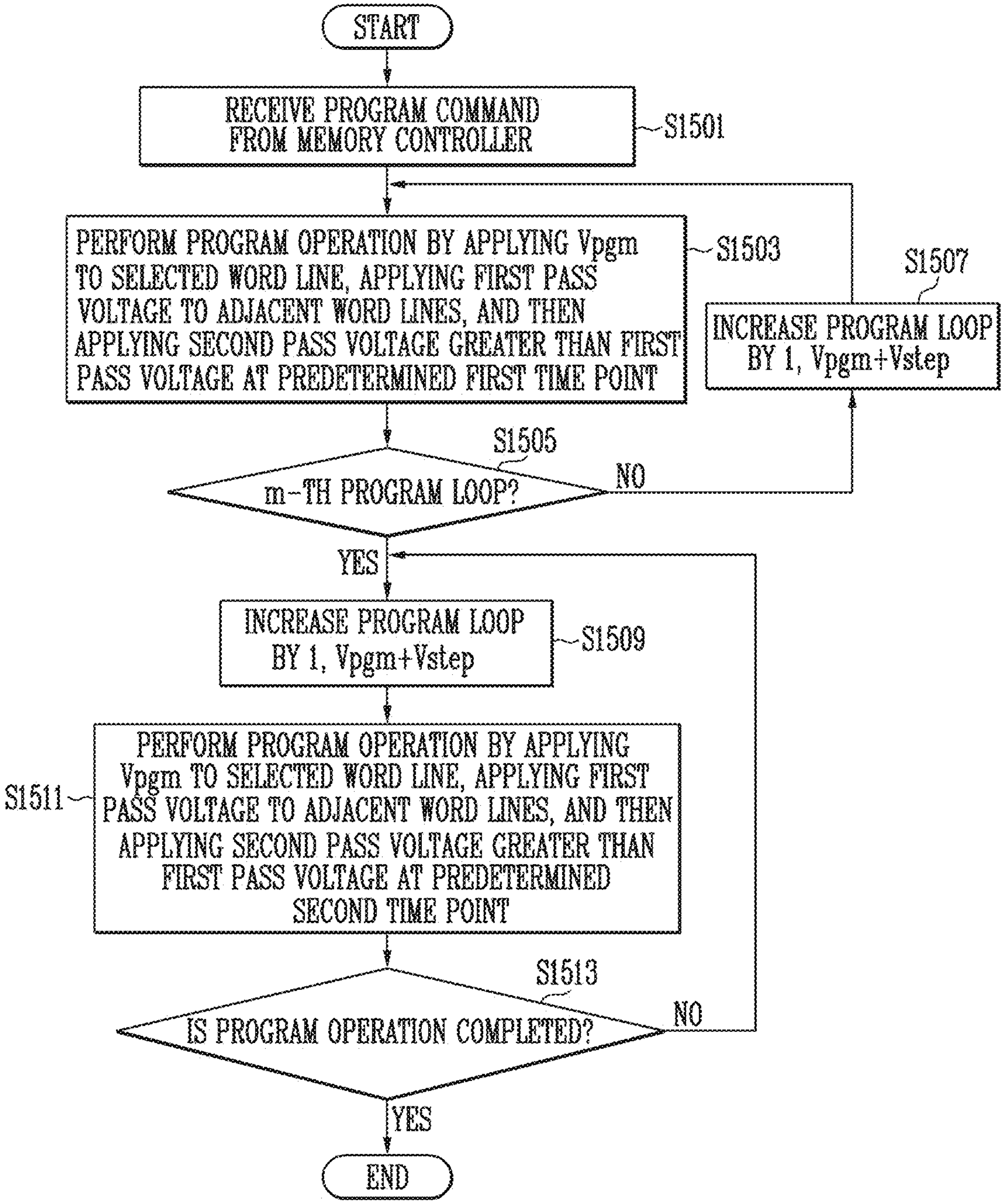
FIG. 15 is a flowchart illustrating an operation of a memory device according to an embodiment.

FIG. 15 is a flowchart illustrating an operation of a memory device according to an embodiment.

In step S1501, the memory device may receive the program command from the memory controller. The program command may be a command to perform the program operation on the memory cells that are connected to the plurality of word lines. The program operation may include the plurality of program loops including the program voltage apply step.

In step S1503, in response to the program command of the memory controller, the memory device may perform the program operation by applying the program voltage Vpgm to the selected word line, applying the first pass voltage to the adjacent word lines, and then applying the second pass voltage that is greater than the first pass voltage at a predetermined first time point.

In step S1505, the memory device may determine whether a currently ongoing program loop is an m-th loop.

When the currently ongoing program loop is not the m-th loop, in step S1507, the memory device may perform the next program loop by using the program voltage Vpgm that is increased by a step voltage Vstep.

When the currently ongoing program loop is the m-th loop, in step S1509, the memory device may increase the program voltage Vpgm of the next loop by the step voltage Vstep. In step S1511, the memory device may perform the program operation by applying the program voltage Vpgm to the selected word line, applying the first pass voltage to the adjacent word lines, and then applying the second pass voltage greater than the first pass voltage at a predetermined second time point. The second time point may be earlier than the first time point. In other words, the length of time in which the first pass voltage is applied to the adjacent word lines in the first to m-th program loops may be longer than the length of time in which the first pass voltage is applied to the adjacent word lines in (m+1)-th to last program loops.

In step S1513, the memory device may check whether the program operation is completed. When the program operation is not completed, the memory device may perform the program operation again from step S1509. When the program operation is completed, the memory device may end the program operation that corresponds to the program command of the memory controller.

Figure 16:
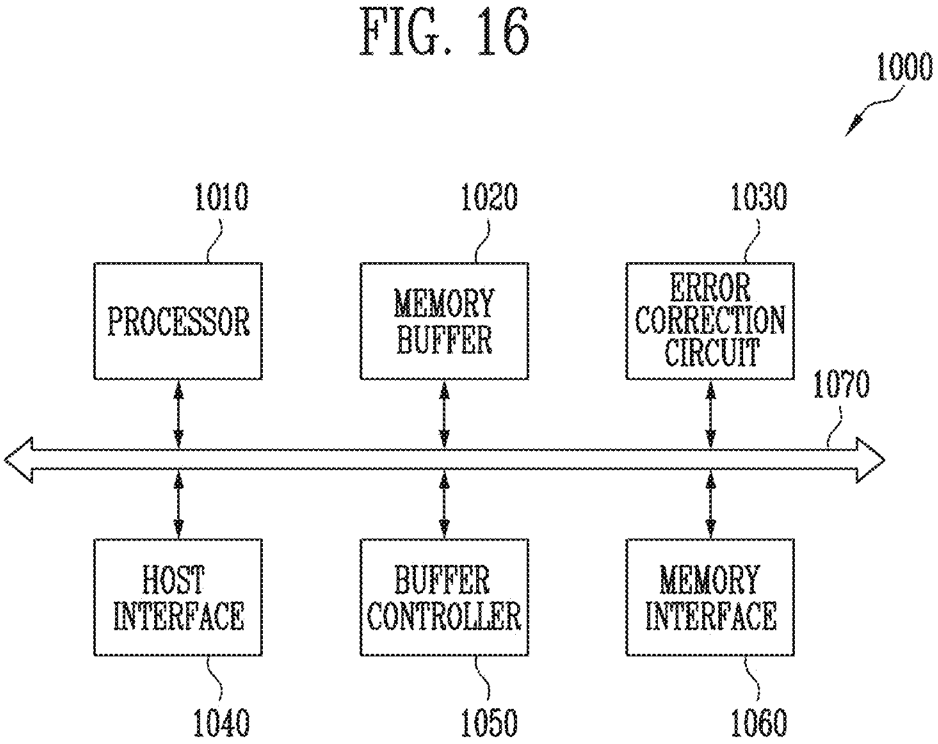
FIG. 16 is a diagram illustrating another embodiment of a memory controller of FIG. 1.

FIG. 16 is a diagram illustrating another embodiment of the memory controller of FIG. 1.

Referring to FIG. 16, the memory controller 1000 may be connected to a host and the memory device. The memory controller 1000 may be configured to access the memory device in response to a request from the host. For example, the memory controller 1000 may be configured to control the write, read, erase, and background operations of the memory device. The memory controller 1000 may be configured to provide an interface between the memory device and the host. The memory controller 1000 may be configured to drive firmware for controlling the memory device.

The memory controller 1000 may include a processor 1010, a memory buffer 1020, an error correction circuit (ECC) 1030, a host interface 1040, a buffer control circuit 1050, a memory interface 1060, and a bus 1070.

The bus 1070 may be configured to provide a channel between components of the memory controller 1000.

The processor 1010 may control an overall operation of the memory controller 1000 and may perform a logical operation. The processor 1010 may communicate with an external host through the host interface 1040 and communicate with the memory device through the memory interface 1060. In addition, the processor 1010 may communicate with the memory buffer 1020 through the buffer controller 1050. The processor 1010 may control an operation of the storage device using the memory buffer 1020 as an operation memory, a cache memory, or a buffer memory.

The processor 1010 may perform a function of an FTL. The processor 1010 may convert an LBA that is provided by the host into a PBA through the FTL. The FTL may receive the LBA by using a mapping table and convert the LBA into the PBA. An address mapping method of the flash translation layer may include various methods according to a mapping unit. A representative address mapping method includes a page mapping method, a block mapping method, and a hybrid mapping method.

The processor 1010 may be configured to randomize data received from the host. For example, the processor 1010 may randomize the data received from the host using a randomizing seed. The randomized data may be provided to the memory device as data to be stored and may be programmed to the memory cell array.

The processor 1010 may be configured to de-randomize data received from the memory device during the read operation. For example, the processor 1010 may de-randomize the data that is received from the memory device using a de-randomizing seed. The de-randomized data may be output to the host.

In an embodiment, the processor 1010 may perform the randomization and the de-randomization by driving software or firmware.

The memory buffer 1020 may be used as an operation memory, a cache memory, or a buffer memory of the processor 1010. The memory buffer 1020 may store codes and commands executed by the processor 1010. The memory buffer 1020 may store data that is processed by the processor 1010. The memory buffer 1020 may include a static RAM (SRAM) or a dynamic RAM (DRAM).

The ECC 1030 may perform error correction. The ECC 1030 may perform error correction encoding (ECC encoding) based on data to be written to the memory device through memory interface 1060. The error correction encoded data may be transferred to the memory device through the memory interface 1060. The ECC 1030 may perform error correction decoding (ECC decoding) on the data that is received from the memory device through the memory interface 1060. For example, the ECC 1030 may be included in the memory interface 1060 as a component of the memory interface 1060.

The host interface 1040 may be configured to communicate with an external host under the control of the processor 1010. The host interface 1040 may be configured to perform communication by using at least one of various communication methods, such as a universal serial bus (USB), a serial AT attachment (SATA), a serial attached SCSI (SAS), a high speed interchip (HSIC), a small computer system interface (SCSI), a peripheral component interconnection (PCI express), a nonvolatile memory express (NVMe), a universal flash storage (UFS), a secure digital (SD), a multimedia card (MMC), an embedded MMC (eMMC), a dual in-line memory module (DIMM), a registered DIMM (RDIMM), and a load reduced DIMM (LRDIMM).

The buffer controller 1050 may be configured to control the memory buffer 1020 under the control of the processor 1010.

The memory interface 1060 may be configured to communicate with the memory device under the control of the processor 1010. The memory interface 1060 may communicate a command, an address, and data with the memory device through a channel.

For example, the memory controller 1000 might not include the memory buffer 1020 and the buffer controller 1050.

For example, the processor 1010 may control the operation of the memory controller 1000 by using codes. The processor 1010 may load the codes from a nonvolatile memory device (for example, a read only memory), provided inside the memory controller 1000. In another example, the processor 1010 may load the codes from the memory device through the memory interface 1060.

For example, the bus 1070 of the memory controller 1000 may be divided into a control bus and a data bus. The data bus may be configured to transmit data within the memory controller 1000 and the control bus may be configured to transmit control information, such as a command and an address within the memory controller 1000. The data bus and the control bus may be separated from each other and might not interfere with each other or affect each other. The data bus may be connected to the host interface 1040, the buffer controller 1050, the ECC 1030, and the memory interface 1060. The control bus may be connected to the host interface 1040, the processor 1010, the buffer controller 1050, the memory buffer 1020, and the memory interface 1060.

Figure 17:
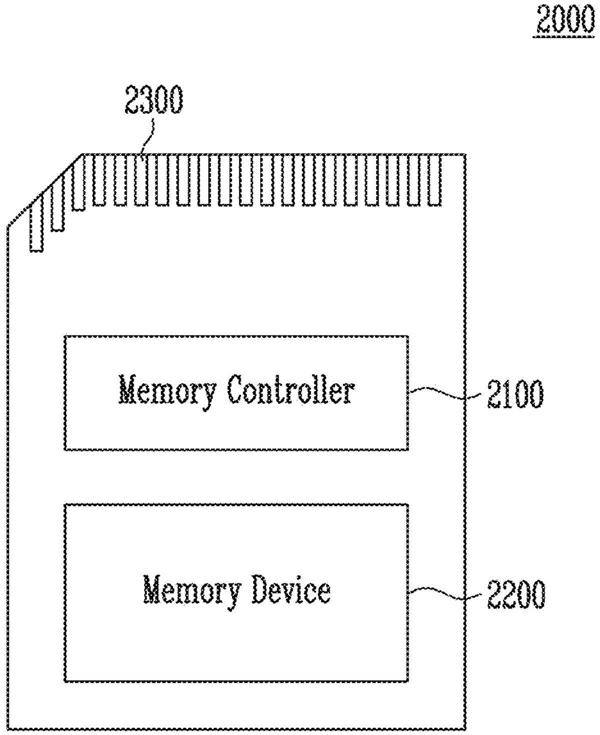
FIG. 17 is a block diagram illustrating a memory card system to which a storage device according to an embodiment of the present disclosure is applied.

FIG. 17 is a block diagram illustrating a memory card system to which a storage device according to an embodiment of the present disclosure is applied.

Referring to FIG. 17, the memory card system 2000 includes a memory controller 2100, a memory device 2200, and a connector 2300.

The memory controller 2100 may be connected to the memory device 2200. The memory controller 2100 may be configured to access the memory device 2200. For example, the memory controller 2100 may be configured to control read, write, erase, and background operations of the memory device 2200. The memory controller 2100 may be configured to provide an interface between the memory device 2200 and a host. The memory controller 2100 may be configured to drive firmware for controlling the memory device 2200. The memory controller 2100 may be implemented identically to the memory controller 200 described with reference to FIG. 1.

For example, the memory controller 2100 may include components, such as a random access memory (RAM), a processor, a host interface, a memory interface, and an ECC.

The memory controller 2100 may communicate with an external device through the connector 2300. The memory controller 2100 may communicate with an external device (for example, the host) according to a specific communication standard. For example, the memory controller 2100 may be configured to communicate with an external device through at least one of various communication standards, such as a universal serial bus (USB), a multimedia card (MMC), an embedded MMC (eMMC), a peripheral component interconnection (PCI), a PCI express (PCI-E), an advanced technology attachment (ATA), a serial-ATA, a parallel-ATA, a small computer system interface (SCSI), an enhanced small disk interface (ESDI), integrated drive electronics (IDE), FireWire, a universal flash storage (UFS), Wi-Fi, Bluetooth, and an NVMe. For example, the connector 2300 may be defined by at least one of the various communication standards described above.

For example, the memory device 2200 may be configured of various nonvolatile memory elements such as an electrically erasable and programmable ROM (EEPROM), a NAND flash memory, a NOR flash memory, a phase-change RAM (PRAM), a resistive RAM (ReRAM), a ferroelectric RAM (FRAM), and a spin-torque magnetic RAM (STT-MRAM).

The memory controller 2100 and the memory device 2200 may be integrated into one semiconductor device to configure a memory card. For example, the memory controller 2100 and the memory device 2200 may be integrated into one semiconductor device to configure a memory card such as a PC card (personal computer memory card international association (PCMCIA)), a compact flash card (CF), a smart media card (SM or SMC), a memory stick, a multimedia card (MMC, RS-MMC, MMCmicro, or eMMC), an SD card (SD, miniSD, microSD, or SDHC), and a universal flash storage (UFS).

Figure 18:
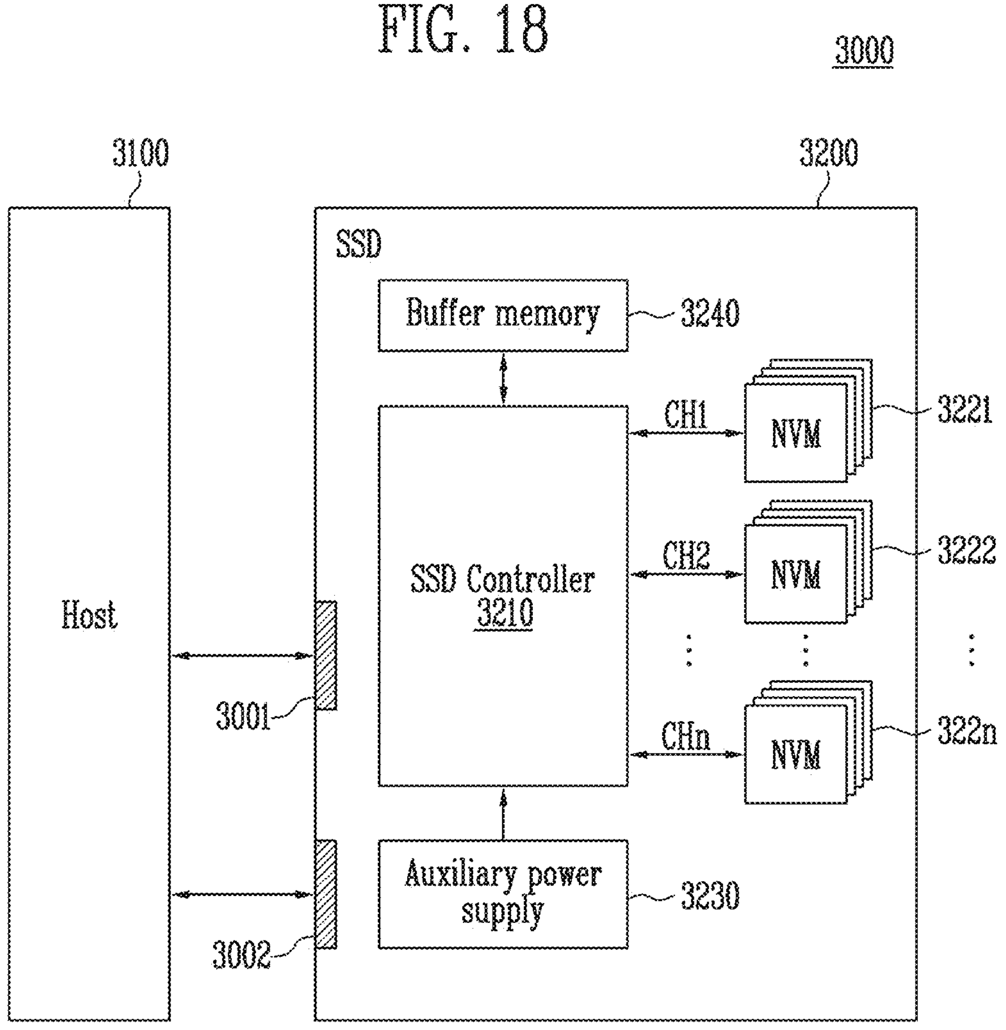
FIG. 18 is a block diagram illustrating a solid state drive (SSD) system to which a storage device according to an embodiment of the present disclosure is applied.

FIG. 18 is a block diagram illustrating a solid state drive (SSD) system to which a storage device according to an embodiment of the present disclosure is applied.

Referring to FIG. 18, the SSD system 3000 may include a host 3100 and an SSD 3200. The SSD 3200 may exchange a signal SIG with the host 3100 through a signal connector 3001 and may receive power PWR through a power connector 3002. The SSD 3200 may include an SSD controller 3210, a plurality of flash memories 3221 to **322*n*, an auxiliary power device 3230, and a buffer memory 3240**.

According to an embodiment of the present disclosure, the SSD controller 3210 may perform the function of the memory controller 200, described with reference to FIG. 1.

The SSD controller 3210 may control the plurality of flash memories 3221 to **322*n* in response to the signal that is received from the host 3100. For example, the signal may be signals based on an interface between the host 3100 and the SSD 3200**. For example, the signal may be a signal that is defined by at least one of interfaces, such as a universal serial bus (USB), a multimedia card (MMC), an embedded MMC (eMMC), a peripheral component interconnection (PCI), a PCI express (PCI-E), an advanced technology attachment (ATA), a serial-ATA, a parallel-ATA, a small computer system interface (SCSI), an enhanced small disk interface (ESDI), integrated drive electronics (IDE), FireWire, a universal flash storage (UFS), Wi-Fi, Bluetooth, and an NVMe.

The auxiliary power device 3230 may be connected to the host 3100 through the power connector 3002. The auxiliary power device 3230 may receive the power PWR from the host 3100 and may charge the power. The auxiliary power device 3230 may provide power of the SSD 3200 when power supply from the host 3100 is not smooth. For example, the auxiliary power device 3230 may be positioned in the SSD 3200 or may be positioned outside the SSD 3200. For example, the auxiliary power device 3230 may be positioned on a main board and may provide auxiliary power to the SSD 3200.

The buffer memory 3240 may operate as a buffer memory of the SSD 3200. For example, the buffer memory 3240 may temporarily store data that is received from the host 3100 or data that is received from the plurality of flash memories 3221 to **322*n* or may temporarily store meta data (for example, a mapping table) of the flash memories 3221 to 322*n*. The buffer memory 3240** may include a volatile memory, such as a DRAM, an SDRAM, a DDR SDRAM, an LPDDR SDRAM, and a GRAM, or a nonvolatile memory such as an FRAM, a ReRAM, an STT-MRAM, and a PRAM.

Figure 19:
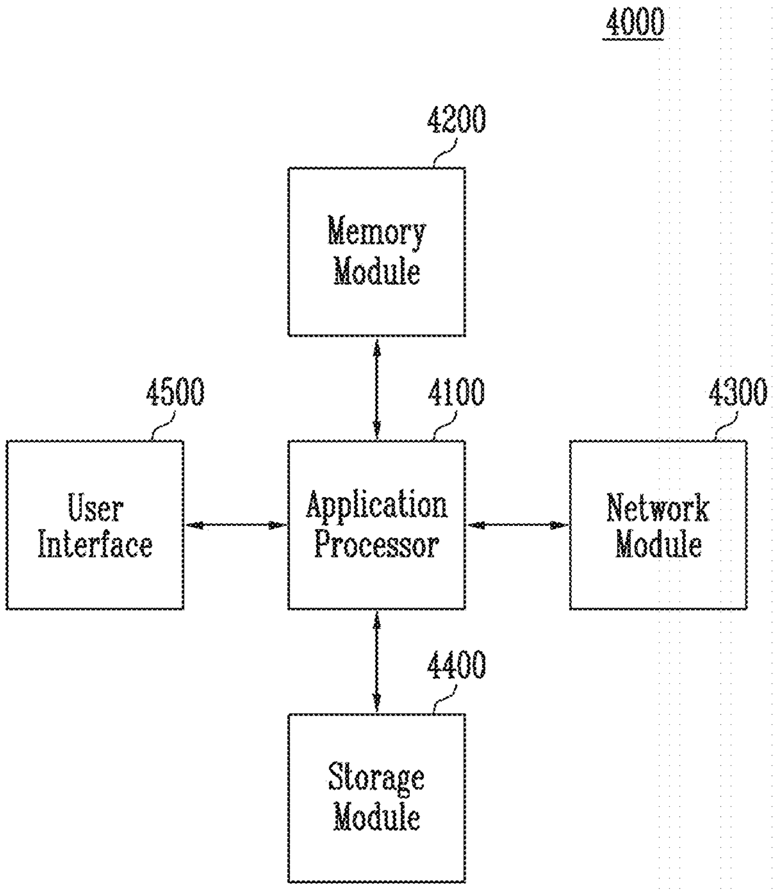
FIG. 19 is a block diagram illustrating a user system to which a storage device according to an embodiment of the present disclosure is applied.

FIG. 19 is a block diagram illustrating a user system to which a storage device according to an embodiment of the present disclosure is applied.

Referring to FIG. 19, the user system 4000 may include an application processor 4100, a memory module 4200, a network module 4300, a storage module 4400, and a user interface 4500.

The application processor 4100 may drive components, an operating system (OS), a user program, or the like included in the user system 4000. For example, the application processor 4100 may include controllers, interfaces, graphics engines, and the like that control the components that are included in the user system 4000. The application processor 4100 may be provided as a system-on-chip (SoC).

The memory module 4200 may operate as a main memory, an operation memory, a buffer memory, or a cache memory of the user system 4000. The memory module 4200 may include a volatile random access memory, such as a DRAM, an SDRAM, a DDR SDRAM, a DDR2 SDRAM, a DDR3 SDRAM, an LPDDR SDARM, an LPDDR2 SDRAM, and an LPDDR3 SDRAM, or a nonvolatile random access memory, such as a PRAM, a ReRAM, an MRAM, and an FRAM. For example, the application processor 4100 and memory module 4200 may be packaged based on a package on package (POP) and provided as one semiconductor package.

The network module 4300 may communicate with external devices. For example, the network module 4300 may support wireless communication, such as code division multiple access (CDMA), global system for mobile communications (GSM), wideband CDMA (WCDMA), CDMA-2000, time division multiple access (TDMA), long term evolution, Wimax, WLAN, UWB, Bluetooth, and Wi-Fi. For example, the network module 4300 may be included in the application processor 4100.

The storage module 4400 may store data. For example, the storage module 4400 may store data that is received from the application processor 4100. Alternatively, the storage module 4400 may transmit data that is stored in the storage module 4400 to the application processor 4100. For example, the storage module 4400 may be implemented as a nonvolatile semiconductor memory element, such as a phase-change RAM (PRAM), a magnetic RAM (MRAM), a resistive RAM (RRAM), a NAND flash, a NOR flash, and a three-dimensional NAND flash. For example, the storage module 4400 may be provided as a removable storage device (removable drive), such as a memory card, and an external drive of the user system 4000.

For example, the storage module 4400 may include a plurality of nonvolatile memory devices, and the plurality of nonvolatile memory devices may operate identically to the memory device 100, described with reference to FIG. 1. The storage module 4400 may operate identically to the storage device 50, described with reference to FIG. 1.

The user interface 4500 may include interfaces for inputting data or an instruction to the application processor 4100 or for outputting data to an external device. For example, the user interface 4500 may include user input interfaces, such as a keyboard, a keypad, a button, a touch panel, a touch screen, a touch pad, a touch ball, a camera, a microphone, a gyroscope sensor, a vibration sensor, and a piezoelectric element. The user interface 4500 may include user output interfaces, such as a liquid crystal display (LCD), an organic light emitting diode (OLED) display device, an active matrix OLED (AMOLED) display device, an LED, a speaker, and a monitor.

What is claimed is:

1. A memory device comprising:

a memory block connected to a plurality of word lines;

a peripheral circuit configured to perform a program operation, including a plurality of program loops, on memory cells that are connected to a selected word line among the plurality of word lines, and configured to apply a program voltage to the selected word line and a pass voltage to an unselected word line among the plurality of word lines in each of the plurality of program loops; and a control logic configured to, while a level of the program voltage being applied to the selected word line is maintained in a program loop among the plurality of program loops, control the peripheral circuit to switch the pass voltage from a first voltage level to a second voltage level different from the first voltage level;

wherein, during a period in which the program voltage is applied to the selected word line, the pass voltage at the first voltage level is applied to the unselected word line and is changed from the first voltage level to the second voltage level.

2. The memory device of claim 1, wherein the second voltage level is higher than the first voltage level.

3. The memory device of claim 2, wherein an application time of the second voltage level of the pass voltage in a first program loop is different from that of a second program loop.

4. The memory device of claim 2, wherein an application time of the second voltage level of the pass voltage in a first program loop is longer than that of a second program loop following the first program loop.

5. The memory device of claim 4, wherein a sum of an application time of the first voltage level of the pass voltage and an application time of the second voltage level of the pass voltage is constant in the plurality of program loops.

6. The memory device of claim 3, wherein the unselected word line is adjacent to the selected word line.

7. The memory device of claim 6, wherein the pass voltage having the first voltage level is applied to the selected word line before the program voltage is applied.

8. The memory device of claim 2, wherein an application time of the second voltage level of the pass voltage increases as the plurality of program loops proceed.

9. A memory device comprising:

a memory block connected to a plurality of word lines including a selected word line and an unselected word line;

a peripheral circuit configured to perform a program operation, including a plurality of program loops, on memory cells that are connected to the selected word line; and a control logic configured to control the peripheral circuit to apply a program voltage to the selected word line and a pass voltage to the unselected word line with multiple time periods including a first, a second and a third time periods in order in a program loop among the plurality of program loops, wherein the control logic controls the peripheral circuit to:

during the first time period, apply the pass voltage having a first voltage level to the selected word line and the unselected word line, during the second time period, apply the program voltage to the selected word line and maintaining the first voltage level of the pass voltage applied to the unselected word line, and during the third time period, apply the pass voltage having a second voltage, different from the first voltage level, to the unselected word line and maintain a voltage level of the program voltage applied to the selected word line.

10. The memory device of claim 9, wherein the control logic adjusts a length of the second time period as the plurality of program loops proceed.

11. The memory device of claim 9, wherein a length of the third time period increases as the plurality of program loops proceed.

12. The memory device of claim 9, wherein the length of the second time period in a first program loop is longer than that of a second program loop following the first program loop.

13. The memory device of claim 12, wherein the unselected word line is adjacent to the selected word line.

14. The memory device of claim 12, wherein the second voltage level is higher than the first voltage level.

15. A method of operating a memory device performing a program operation including a plurality of program loops on memory cells that are connected to a selected word line among a plurality of word lines, the method comprising:

applying a program voltage to the selected word line; and applying a pass voltage to an adjacent word line that is adjacent to the selected word line while the program voltage is applied to the selected word line;

wherein the applying the pass voltage comprises:

switching the pass voltage from a first voltage level to a second voltage level higher than the first voltage level while maintaining a voltage level of the program voltage being applied to the selected word line;

wherein, during a period in which the program voltage is applied to the selected word line, the pass voltage at the first voltage level is applied to the adjacent word line and is changed from the first voltage level to the second voltage level.

16. The method of claim 15, wherein a time point of the switching is adjusted as the plurality of program loops proceed.

17. The method of claim 16, wherein the time point of the switching becomes earlier as the plurality of program loops proceed.

18. The method of claim 15, wherein, before applying the program voltage to the selected word line, the pass voltage having the first voltage level is applied to the selected word line and the adjacent word line.

* * * * *